(12) United States Patent
Lynch et al.

(10) Patent No.: US 8,928,353 B2
(45) Date of Patent: Jan. 6, 2015

(54) BINARY HALF-ADDER USING OSCILLATORS

(75) Inventors: Stephen Lynch, Congleton (GB); Jon Borresen, Manchester (GB)

(73) Assignee: Manchester Metropolitan University, Manchester (GB)

( * ) Notice: Subject to any disclaimer, the term of this patent is extended or adjusted under 35 U.S.C. 154(b) by 0 days.

(21) Appl. No.: 13/807,022

(22) PCT Filed: Jul. 1, 2011

(86) PCT No.: PCT/GB2011/000999
§ 371 (c)(1),
(2), (4) Date: Dec. 27, 2012

(87) PCT Pub. No.: WO2012/001372
PCT Pub. Date: Jan. 5, 2012

(65) Prior Publication Data
US 2013/0093458 A1    Apr. 18, 2013

(30) Foreign Application Priority Data

Jul. 1, 2010 (GB) .................................. 1011110.2

(51) Int. Cl.
| | | |
|---|---|---|
| G06F 7/50 | (2006.01) | |
| H03K 19/21 | (2006.01) | |
| G06F 7/502 | (2006.01) | |
| G06F 7/38 | (2006.01) | |
| H03K 19/195 | (2006.01) | |
| G06N 3/04 | (2006.01) | |
| G06N 3/02 | (2006.01) | |

(52) U.S. Cl.
CPC .............. *G06F 7/502* (2013.01); *G06F 7/381* (2013.01); *H03K 19/21* (2013.01); *H03K 19/195* (2013.01); *G06N 3/049* (2013.01); *G06F 2207/4824* (2013.01); *G06N 3/02* (2013.01)

USPC .......... 326/52; 326/6; 326/7; 326/53; 326/104

(58) Field of Classification Search
None
See application file for complete search history.

(56) References Cited

U.S. PATENT DOCUMENTS

| 3,054,070 A | 9/1962 | Rutz |
| 3,089,038 A | 5/1963 | Rutz |

(Continued)

FOREIGN PATENT DOCUMENTS

| GB | 876550 A | * 9/1961 |
| GB | 1320379 A | 6/1973 |

(Continued)

OTHER PUBLICATIONS

Schauer, "Some Applications of Magnetic File Parametrons as Logical Devices", IRE Transactions on Electronic Computers, Sep. 1960, pp. 315-320.
P Crotty, et al. "Josephson junction simulation of neurons", Phys Rev. Feb. 23, 2010, pp. 1-10, Hamilton, NY, USA.
Intellectual Property Office Search Report, Application No. GB1011110.2, Nov. 9, 2010.

(Continued)

*Primary Examiner* — Anh Tran

(57) ABSTRACT

A binary half-adder comprising first and second oscillators, each oscillator being connected to a first input and to a second input, the second oscillator being connected to the first oscillator, wherein the first oscillator is configured to oscillate if the first input is high or the second input is high, the second oscillator is configured to oscillate if the first and the second inputs are high, and wherein the connection between the second oscillator and the first oscillator is configured to suppress oscillation of the first oscillator if the second oscillator is oscillating.

18 Claims, 14 Drawing Sheets

(56) References Cited

U.S. PATENT DOCUMENTS

| | | | |
|---|---|---|---|
| 3,163,775 A * | 12/1964 | Peil | 326/132 |
| 3,272,990 A | 9/1966 | Kawamoto et al. | |
| 3,351,773 A | 11/1967 | Wolf et al. | |
| 5,664,211 A | 9/1997 | Sobelman et al. | |
| 6,581,046 B1 | 6/2003 | Ahissar | |

FOREIGN PATENT DOCUMENTS

| | | |
|---|---|---|
| GB | 1321459 | 6/1973 |
| JP | 58187025 | 4/1982 |

OTHER PUBLICATIONS

Intellectual Property Office Search Report, Application No. GB1111316.4, Oct. 24, 2011.

International Search Report issued Sep. 22, 2011 in International Patent Application No. PCT/GB2011/000999.

Ashwin, Borresen, 'Encoding via conjugate symmetries of slow oscillation for globally coupled oscillators,' Physical Review, (2004).

Ashwin, Borresen, 'Discrete computation using a perturbed heteroclinic network,' Physics Letters, (2005), pp. 208-214.

Xu et al, 'Logic computation using coupled neural oscillators,' Computational NeuroEngineering Laboratory, (2004).

* cited by examiner

BINARY HALF-ADDER USING OSCILLATORS

The present invention relates to a binary half-adder and to other logic circuits.

A binary half-adder is a logic circuit which adds two one-bit binary numbers together. Binary half-adders may be used to construct more complex logic circuits such as full-adders. Binary half-adders are the primary units that are used to construct arithmetic logic units. Arithmetic logic units are the primary units that are used to construct computer processors. The binary half-adders may for example be provided on a semiconductor chip, the half-adders being connected together such that they provide logic required by the computer processor.

It is an object of the invention to provide a binary half-adder which is formed in a manner not known in the art.

According to a first aspect of the invention there is provided a binary half-adder comprising first and second oscillators, each oscillator being connected to a first input and to a second input, the second oscillator being connected to the first oscillator, wherein the first oscillator is configured to oscillate if the first input is high or the second input is high, the second oscillator is configured to oscillate if the first and the second inputs are high, and wherein the connection between the second oscillator and the first oscillator is configured to suppress oscillation of the first oscillator if the second oscillator is oscillating.

Each oscillator may be configured to tend towards a stable non-oscillating state in the absence of an external input, and may be configured to oscillate at a limit-cycle in the presence of an external input which is above a threshold.

At least one of the oscillators may be configured to tend towards a stable non-oscillating state if the external input exceeds an upper threshold.

The first oscillator and the second oscillator may be electrical circuits.

The first oscillator and the second oscillator may comprise a plurality of FETs.

The first oscillator and the second oscillator may be Fitzhugh-Nagumo oscillators, and an electrical circuit may provide the connection between the second oscillator and the first oscillator, the connection being an inhibitory connection.

The first oscillator may be formed from a pair of Josephson junctions, the second oscillator may be formed from a pair of Josephson junctions, and an electrical circuit may provide the connection between the second oscillator and the first oscillator, the connection being an inhibitory connection.

The connection between the second oscillator and the first oscillator may comprise a slave oscillator which is configured to oscillate out of phase with the first oscillator and thereby cause oscillator death of the first oscillator.

The second oscillator may have a higher threshold than the first oscillator.

The first oscillator may receive a greater bias current or bias voltage than the second oscillator.

Connections from the first and second inputs to the second oscillator may have a higher impedance than connections from the first and second inputs to the first oscillator.

The first oscillator and the second oscillator may be neurons, the connection may be a synapse, and the second neuron may be configured to produce an inhibitory neurotransmitter when it is oscillating.

A binary adder may comprise a first binary half-adder according to the first aspect of the invention and a second binary half-adder according to the first aspect of the invention, the binary half-adders being combined together with an additional oscillator.

According to a second aspect of the invention there is provided a binary adder comprising a binary half adder according to the first aspect of the invention, and further comprising a third oscillator which is connected to the second oscillator, the connection between the third oscillator and the second oscillator being configured to suppress oscillation of the second oscillator if the third oscillator is oscillating, and wherein the first, second and third oscillators are each connected to first, second and third inputs, the first oscillator being configured to oscillate if any of the first, second or third inputs are high, the second oscillator being configured to oscillate if any two of the first, second or third inputs are high, and the third oscillator being configured to oscillate if the first, second and third inputs are high.

According to a third aspect of the invention there is provided a binary half-adder comprising first and second oscillators, each oscillator being connected to a first input and to a second input, the second oscillator being connected to an output of the first oscillator, wherein the first oscillator is configured to oscillate if the first input is high or the second input is high, the second oscillator is configured to oscillate if the first and the second inputs are high, and wherein the first and second oscillators are configured to oscillate at the same frequency, and the connection between the second oscillator and the output of the first oscillator is configured that the output from the second oscillator will combine in anti-phase with the output from the first oscillator when the first and second oscillators are oscillating.

According to a fourth aspect of the invention there is provided a logic circuit comprising a first oscillator connected to a second oscillator, the connection between the second oscillator and the first oscillator being configured to suppress oscillation of the first oscillator if the second oscillator is oscillating, wherein the first oscillator is connected to a power supply such that the first oscillator will oscillate unless oscillation of the first oscillator is suppressed by the second oscillator.

Two inputs may be provided to the second oscillator and the threshold of the second oscillator may be such that the second oscillator will oscillate if the first input is high or the second input is high.

Two inputs may be provided to the second oscillator and the threshold of the second oscillator may be such that the second oscillator will only oscillate if both the first and second inputs are high.

According to a fifth aspect of the invention there is provided a binary half-adder comprising first and second oscillators, each oscillator being connected to a first input and to a second input, the second oscillator being connected to the first oscillator via a connection, wherein the first oscillator is configured to oscillate if the first input is high or the second input is high, the second oscillator is configured to oscillate if the first and the second inputs are high, and wherein the first oscillator is configured such that it will not oscillate if it receives a signal via the connection which indicates that the second oscillator is oscillating.

Two binary half-adders according to the fifth aspect of the invention may be used to form a binary adder.

A computer may be constructed using binary half-adders according to the invention.

A specific embodiment of the invention will now be described by way of example only, with reference to the accompanying figures, in which.

Figure 8:
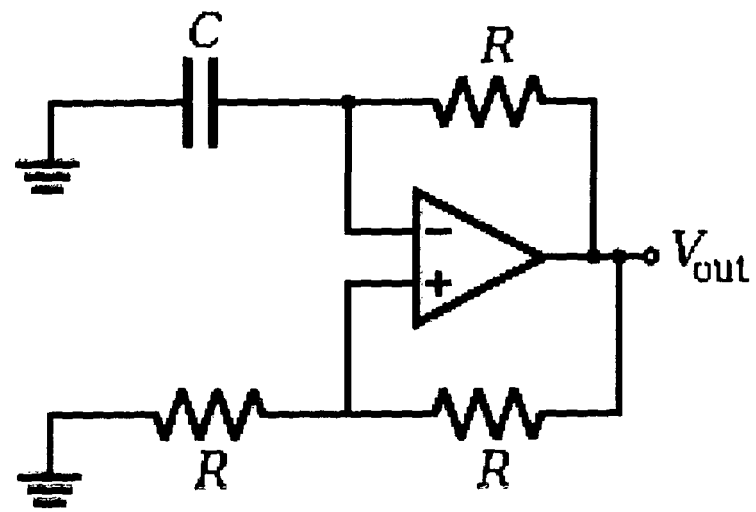
FIG. 8 is a circuit diagram of a Schmitt trigger oscillator which may form part of an embodiment of the invention.
Figure 9:
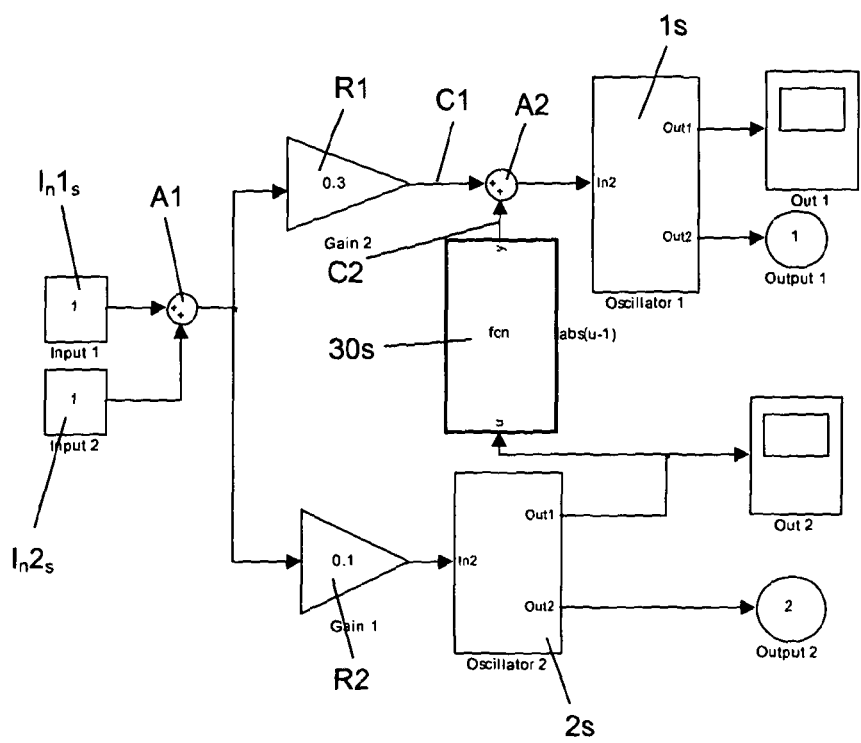
Figure 10:
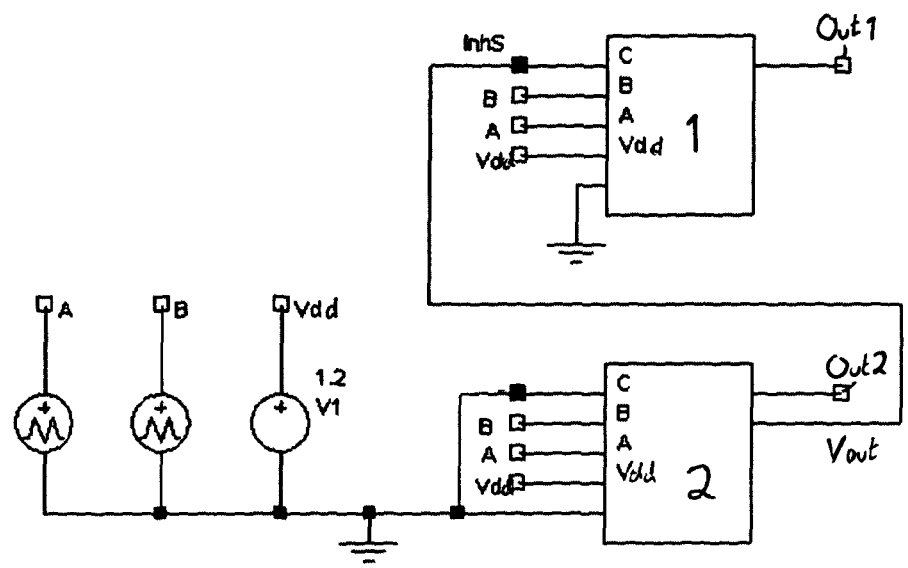
Figure 11:
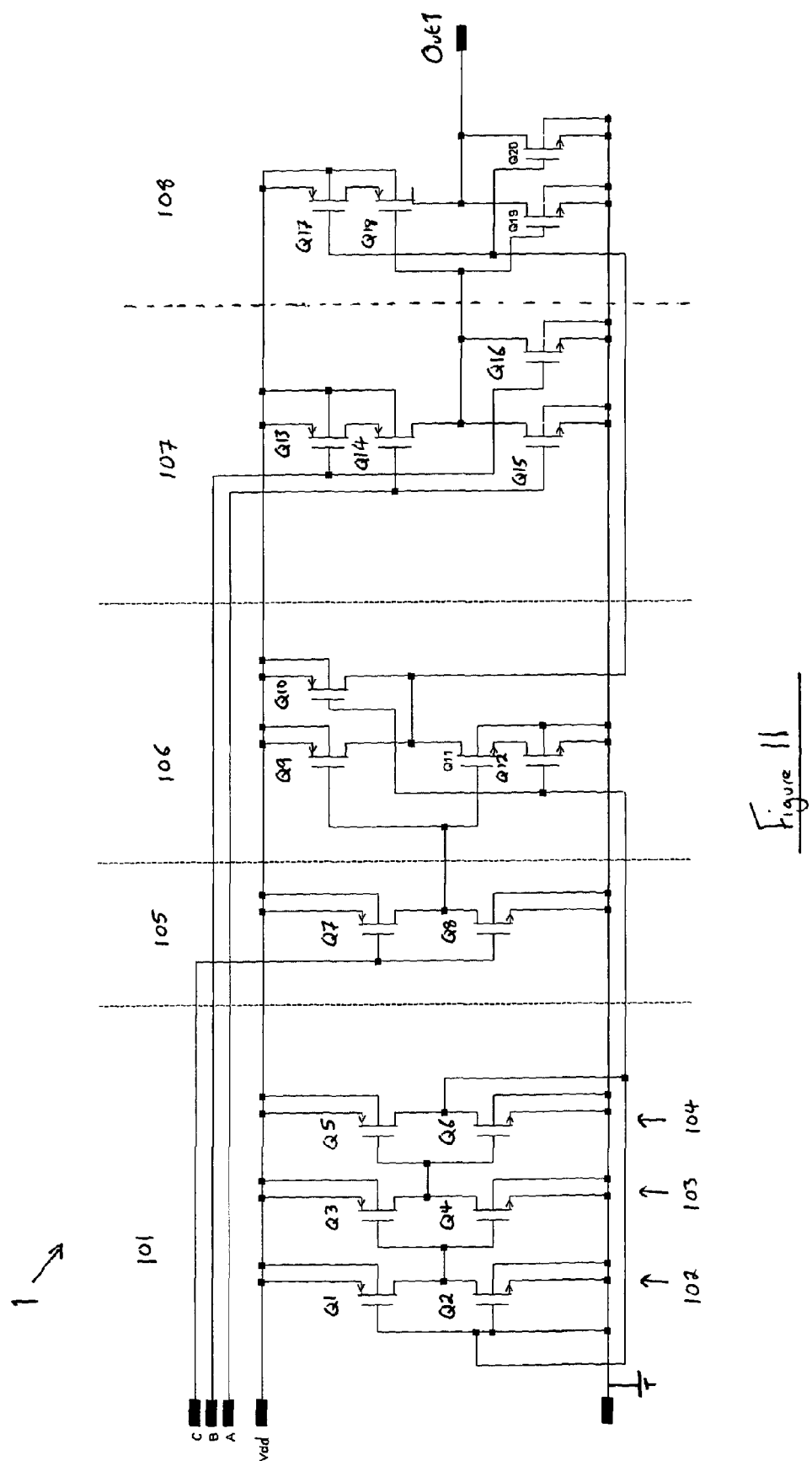
Figure 12:
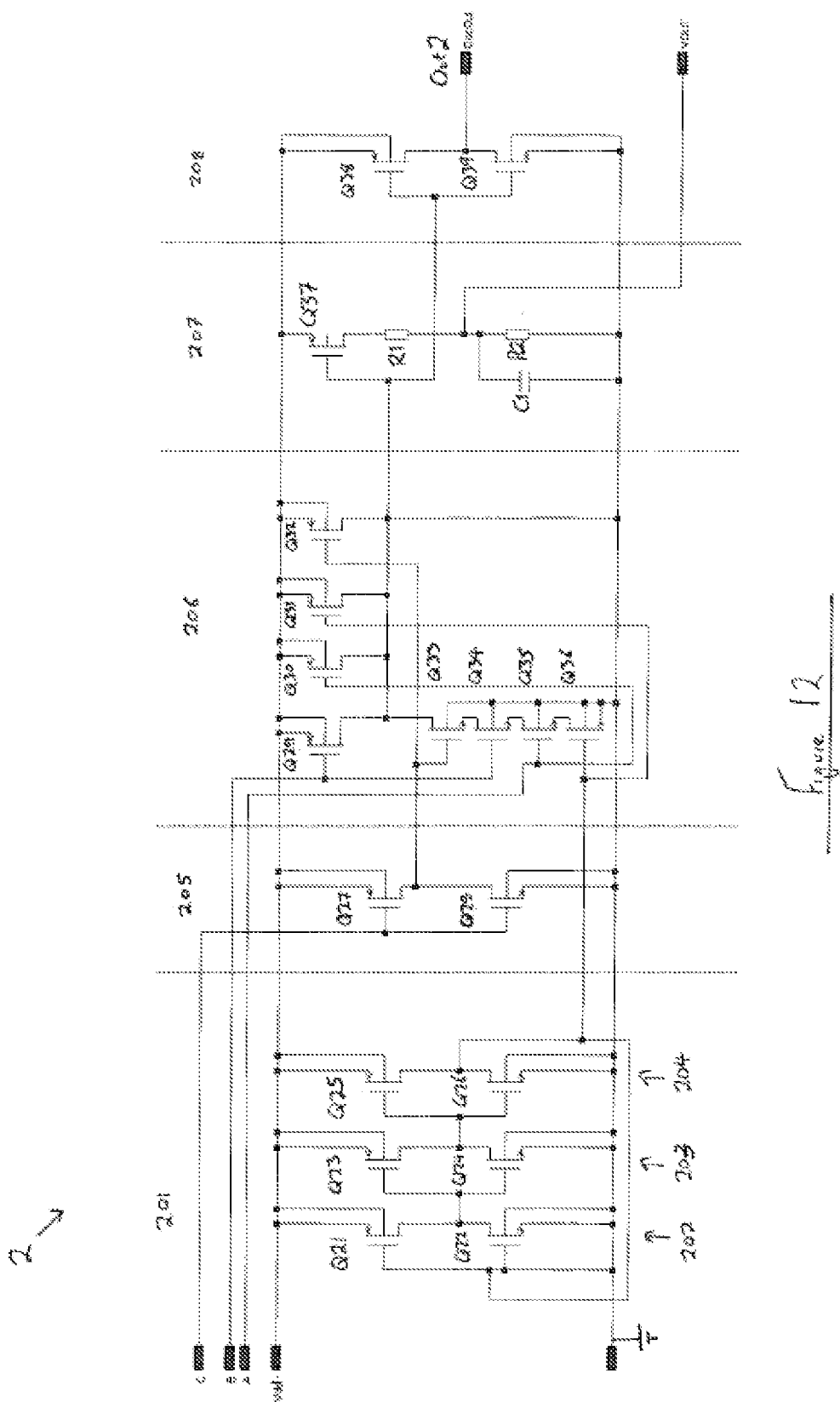
Figure 13:
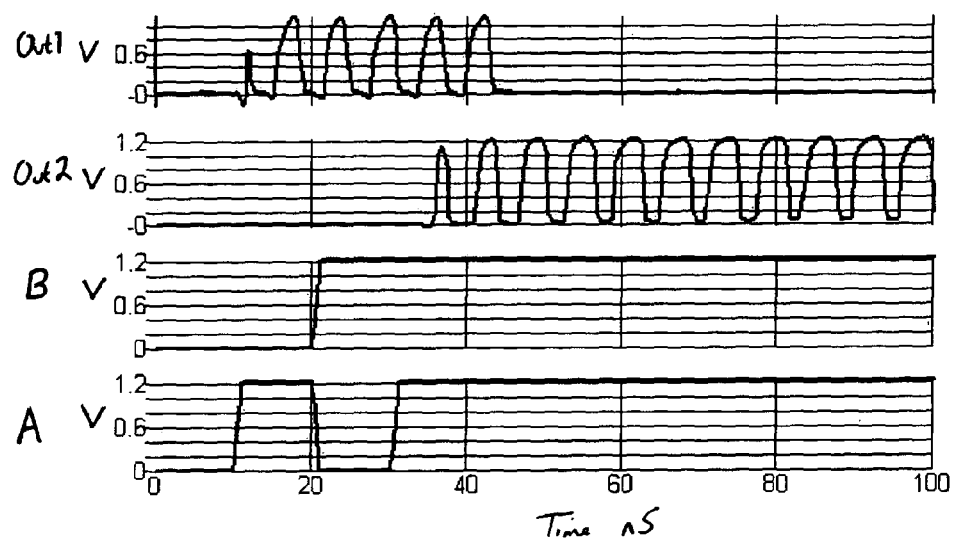
Figure 14:
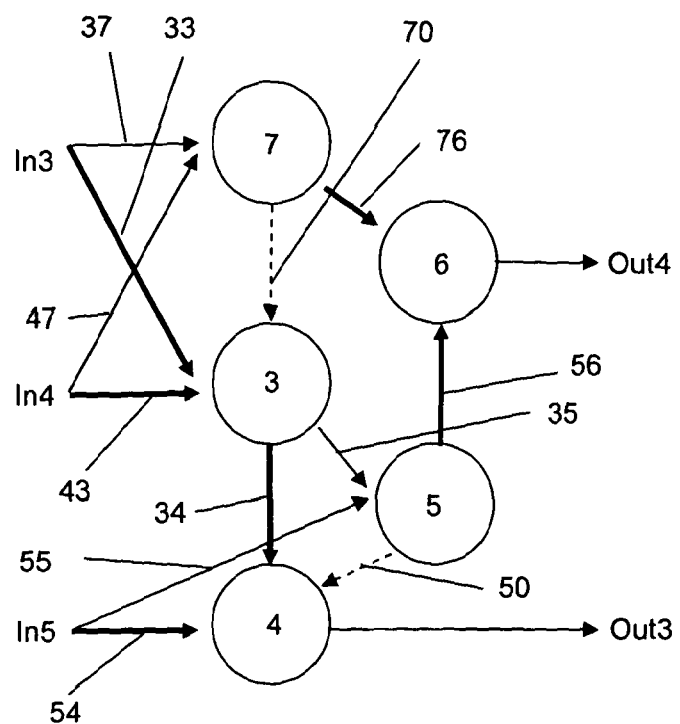
Figure 15:
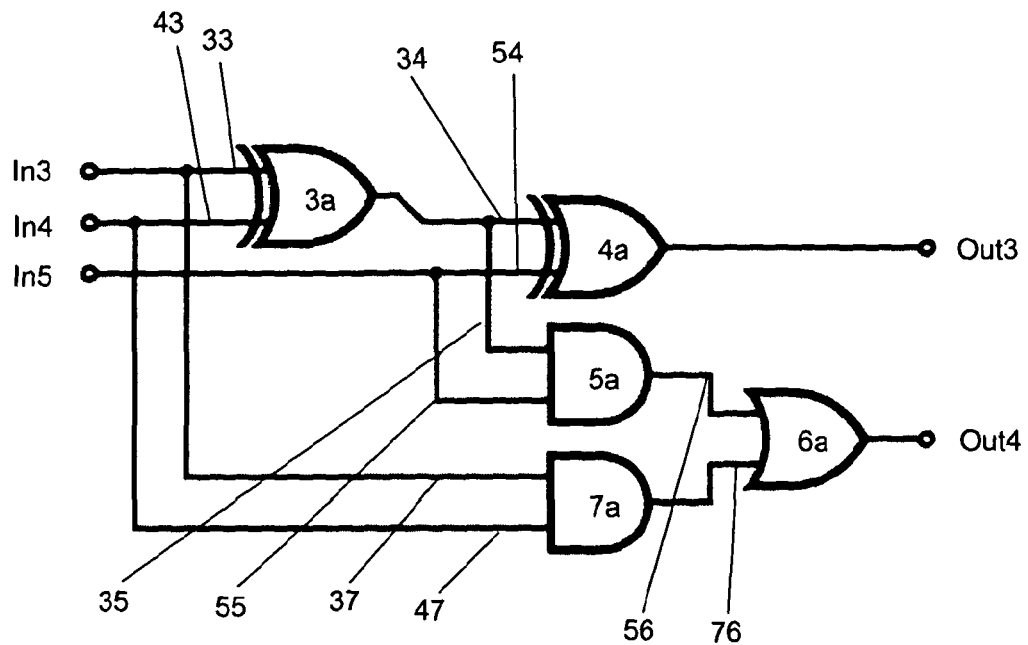
Figure 16:
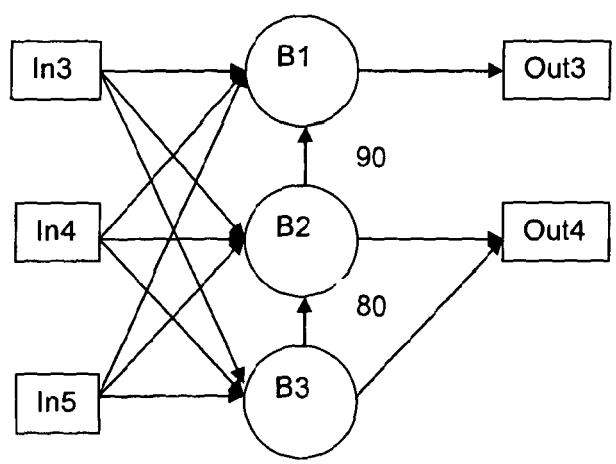
Figure 17:
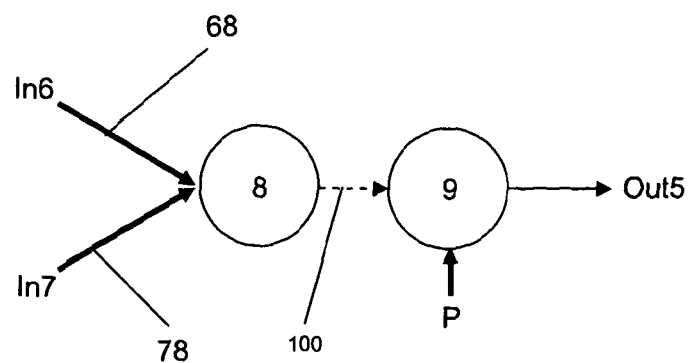
Figure 18:
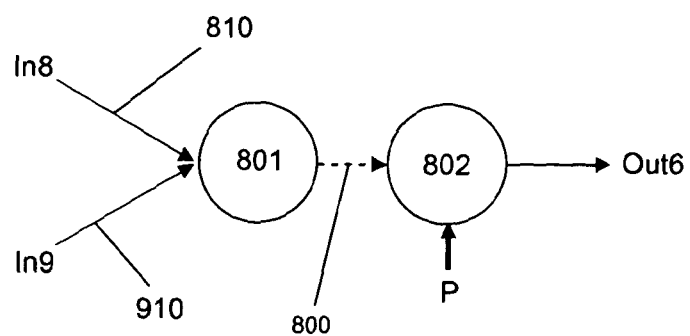

FIG. 9 schematically shows a simulation of a binary half-adder according to an embodiment of the invention;

FIG. 10 is a high level representation of an integrated circuit according to an embodiment of the invention;

FIG. 11 is a component level representation of a first part of the integrated circuit shown in FIG. 10;

FIG. 12 is a component level representation of a second part of the integrated circuit shown in FIG. 10;

FIG. 13 is a set of graphs which show the operation of the integrated circuit shown in FIGS. 8-10;

FIG. 14 is a schematic illustration of a binary adder according to an embodiment of the invention;

FIG. 15 is a logic gate diagram of a binary adder which is equivalent to the embodiment shown in FIG. 14;

FIG. 16 is a schematic illustration of a binary adder according to an embodiment of the invention;

FIG. 17 is a schematic illustration of a NOR logic gate according to an embodiment of the invention; and FIG. 18 is a schematic illustration of a NAND logic gate according to an embodiment of the invention.

Figure 1:
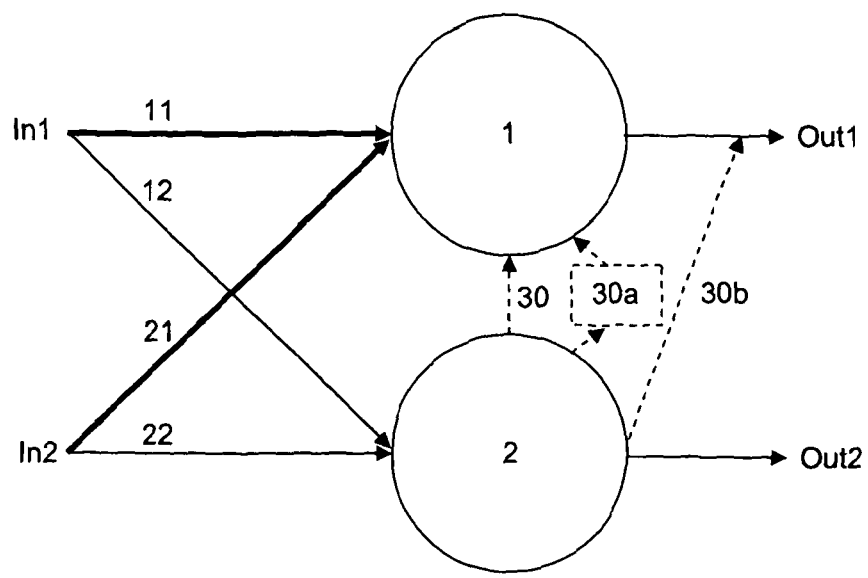
FIG. 1 is a schematic illustration of a binary half-adder according to an embodiment of the invention.

Referring to FIG. 1, a pair of oscillators 1,2 are schematically shown which are configured to operate as a binary half-adder in accordance with an embodiment of the invention.

Each oscillator is configured to tend towards a stable non-oscillating state in the absence of an external input, and is configured to oscillate at a limit-cycle in the presence of an external input which is above a pre-determined threshold. Each oscillator may for example be a Fitzhugh-Nagumo oscillator. Each oscillator may be configured to tend towards a stable non-oscillating state if the external input exceeds a pre-determined upper threshold (for example if the oscillator is a Fitzhugh-Nagumo oscillator), although this may not be the case for some oscillators. A first input In1 passes via connections 11, 12 to the first and second oscillators 1, 2. The first connection 11 has a low resistance, and the second connection 12 has a high resistance. This is shown schematically in FIG. 1 by indicating the first connection 11 as a thick line and the second connection as a thin line 12. A second input In2 passes via connections 21, 22 to the first and second oscillators 1, 2. The first connection 21 has a low resistance, and the second connection 22 has a high resistance (again indicated by a thick line and a thin line). A connection 30 extends between the second oscillator 2 and the first oscillator 1.

In operation, when the first and second inputs In1, In2 are low, neither of the oscillators 1, 2 oscillates. This is because the signals received at the oscillators 1,2 via the connections 11, 12, 21 and 22 are not sufficiently high to achieve a threshold level required for oscillation.

When the first input In1 is high and the second input In2 is low, the first oscillator 1 will oscillate. The first oscillator 1 oscillates because the magnitude of the signal received at the first oscillator is sufficiently high to exceed a threshold level above which the first oscillator will oscillate. The magnitude of the signal is sufficiently high because the first connection 11 has a low resistance and thus does not significantly reduce the magnitude of the input signal. The second oscillator 2 does not oscillate. This is because the magnitude of the signal received at the second oscillator is lower than the threshold level above which the second oscillator will oscillate, the magnitude of the input signal having been reduced by the high resistance of the second connection 12.

When the first input In1 is low and the second input In2 is high, the first oscillator 1 will oscillate. The first oscillator oscillates because the magnitude of the signal received via the first connection 21 is sufficiently high to exceed a threshold level above which the first oscillator will oscillate. This is because the first connection 21 has a low resistance and thus does not significantly reduce the magnitude of the input signal. The second oscillator 2 does not oscillate. This is because the magnitude of the signal received at the second oscillator is lower than the threshold level above which the second oscillator will oscillate, the magnitude of the input signal having been reduced by the high resistance of the second connection 22.

When the first and second inputs In1, In2 are high, the second oscillator 2 oscillates. This is because the magnitude of the first input signal (provided to the second oscillator 2 via the second connection 12) and the second input signal (provided to the second oscillator 2 via the second connection 22), when added together, exceed the threshold required to cause oscillation to occur. Thus, even though the magnitude of the input signals has been reduced by the high resistance of the second connections 12, 22, the high inputs in combination are sufficient to exceed the required threshold to cause oscillation of the second oscillator 2.

When the second oscillator 2 is oscillating, the first oscillator 1 will not oscillate. This is because the connection 30 between the second oscillator 2 and the first oscillator 1 suppresses oscillation of the first oscillator when the second oscillator is oscillating. The manner in which suppression of oscillation of the first oscillator 1 is achieved is explained further below.

Table 1 is a truth table for the oscillators shown in FIG. 1. The truth table reflects the above description, and demonstrates that the oscillators 1, 2 act as a binary half-adder.

TABLE 1

| In1 | In2 | Out2 | Out1 |
|---|---|---|---|
| 0 | 0 | 0 | 0 |
| 0 | 1 | 0 | 1 |
| 1 | 0 | 0 | 1 |
| 1 | 1 | 1 | 0 |

As mentioned further above, the connection 30 between the second oscillator 2 and the first oscillator 1 suppresses oscillation of the first oscillator 1 when the second oscillator 2 is oscillating. If this connection were not present, then both the first and second oscillators 1,2 would oscillate when both of the inputs In1, In2 were high. The connection 30 between the second oscillator 2 and the first oscillator 1 thus changes the logic provided by the first oscillator from OR logic to XOR logic. It is this operation of the first oscillator 1 as an XOR oscillator which allows a binary half-adder to be constructed using the oscillators. The connection 30 may be a one-way connection, which carries a signal from the second oscillator 2 to the first oscillator 1. In electronics terms, the connection 30 may comprise a diode.

In an embodiment, simulated neural hyper-polarization passes from the second oscillator 2 to the first oscillator 1 via the connection 30, the simulated neural hyper-polarization suppressing oscillation of the first oscillator. One way in which neural hyper-polarization may be simulated is by configuring the first and second oscillators 1,2 and the connection 30 such that the second oscillator 2 affects the oscillation parameters of the first oscillator 1. For example, the second oscillator 2 may affect the oscillation parameters of the first oscillator 1 such that the input provided to the first oscillator 1 via connection 11 and/or connection 21 is not sufficient to cause the first oscillator to oscillate.

In an alternative embodiment, instead of the first and second oscillators 1,2 being connected by connection 30, the second oscillator 2 is connected to the first oscillator via a slave oscillator (indicated by dashed lines 30a in FIG. 1). The slave oscillator 30a is connected to the second oscillator 2 such that when the second oscillator 2 is oscillating, the slave oscillator 30a also oscillates. Oscillation of the slave oscillator 30a does not affect the oscillation of the second oscillator 2. However, the slave oscillator 30a is coupled to the first oscillator 1 and has an output which is out of phase with the first oscillator 1. The slave oscillator 30a is configured such that the degree to which it is out of phase with the first oscillator 1 is sufficient to cause oscillator death of the first oscillator 1 (via the coupling between the first oscillator 1 and slave oscillator 30a) when both the first oscillator 1 and slave oscillator 30a are oscillating. Oscillator death due to the coupling of the first oscillator 1 and slave oscillator 30a may also cause the slave oscillator 30a to stop oscillating. It is for this reason that in this embodiment the first oscillator 1 is coupled to a slave oscillator 30a and not directly to the second oscillator 2. If the first oscillator and second oscillator 1,2 were to be coupled directly to one another with a connection which allowed oscillator death to occur in this manner, then oscillation of the first oscillator 1 could suppress the oscillation of the second oscillator 2 and hence the truth table for the oscillators would not be that of a binary half-adder.

The oscillation frequencies of the first oscillator 1 and the slave oscillator 30a may be the same or may be different.

In a further alternative embodiment, instead of the first and second oscillators 1, 2 being connected by connection 30, the second oscillator has a second output (indicated by dashed line 30b in FIG. 1) which is connected to the output Out1 of the first oscillator 1. The output Out1 is therefore a sum of the output of the first oscillator 1 and the second output 30b of the second oscillator 2. A timing circuit (not shown) linked to the first and second oscillators 1, 2, ensures that their outputs have the same frequency and are in anti-phase. Because the output of the first oscillator 1 and the second output 30b of the second oscillator 2 are in anti-phase, when the first and second oscillators 1, 2 are both oscillating, the output Out1 has an amplitude which is reduced when compared to the output Out1 when only the first oscillator 1 is oscillating. The reduced amplitude of output Out1 when both the first and second oscillators 1, 2 are oscillating may be zero (or substantially zero).

Figure 2:
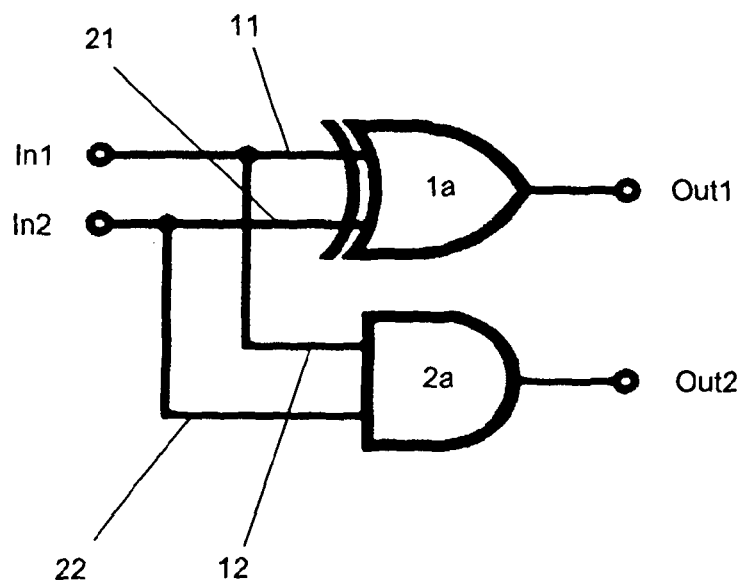
FIG. 2 is a logic gate diagram of a binary half-adder which is equivalent to the embodiment shown in FIG. 1.

FIG. 2 shows a logic gate configuration which operates in an equivalent manner to the oscillators 1 and 2 (the logic gate configuration is a binary half-adder). Logic gate 1a is a XOR gate which is equivalent to oscillator 1. Logic gate 2a is an AND gate which is equivalent to oscillator 2. Equivalent connections, inputs and outputs have been given the numbering that was used in FIGS. 1 and 2.

Referring again to FIG. 1, in the above described embodiment, the resistance of the connections 11, 12, 21, 22 is used to modify the input signals In1, In2 such that a single input signal will exceed the threshold of the first oscillator 1, but two input signals are required to exceed the threshold of the second oscillator 2. In an alternative embodiment, the connections 11, 12, 21, 22 do not significantly modify the input signals, but instead the thresholds of the first and second oscillators are different. For example, the threshold of the second oscillator 2 may be higher than the threshold of the first oscillator 1. Thus, a single high input is sufficient to exceed the threshold of the first oscillator 1, but two high inputs are needed to exceed the threshold of the second oscillator 2. This alternative embodiment provides the same logic as the embodiment described further above.

In a further alternative embodiment, there is no significant difference between the connections 11, 12, 21, 22 nor is there a significant difference between the first and second oscillators 1, 2. Instead, an additional input is connected to the first oscillator 1. This additional input provides a continuous signal which brings the first oscillator 1 closer to its threshold than the second oscillator 2. In the presence of this continuous signal, a single high input is sufficient to cause the oscillator 1 to exceed its threshold. Two high inputs are needed to cause the second oscillator to exceed its threshold, since it does not receive the continuous signal. This further alternative embodiment provides the same logic as the embodiment described further above.

The above are examples of ways in which the first oscillator can be made to oscillate in the presence of a single high input, and the second oscillator can be made to oscillate only in the presence of two high inputs. Other ways of achieving this logic may be used.

As mentioned further above, the oscillators 1,2 are limit-cycle oscillators. The oscillators thus switch from a stable fixed point when inputs lie below a threshold to a stable limit-cycle oscillation when inputs lie above the threshold. One example of an oscillator which may be used is the Fitzhugh-Nagumo oscillator (although other oscillators may be used as described further below). A Fitzhugh-Nagumo oscillator is an excitable system which can be used to model the electrical activity of a neuron. An excitable system is a system which has a ground state and which can be excited by an external input from the ground state into an excited state. A simulation of the half-adder of FIG. 1 has been constructed in which the first and second oscillators 1,2 are modelled as Fitzhugh-Nagumo oscillators. Each oscillator is modelled using the following equations:

$$\frac{du}{dt} = 20\left(u - v - \frac{u^3}{3}\right) + 1, \quad \text{Eqn. 1}$$

$$\frac{dv}{dt} = u - 1.2v - 0.3 + c_1, \quad \text{Eqn. 2}$$

where $c_1$ is the external input voltage, u is a voltage linked to excitation of the oscillator and v is the recovery of voltage. A neuron can be stimulated by an input, for example an external input voltage. After stimulation by the input, the neuron may move to an excited state. The excited state of the neuron is described in the Fitzhugh-Nagumo model by voltage u, which represents the excitation of the neuron as a function of time. When a neuron is excited, physiological processes will urge the neuron to recover to its unexcited state. Within the Fitzhugh-Nagumo model, v is a voltage which is a parameter which characterises the recovery of the neuron. The stimulus which causes the excitation of the neuron is characterised in the model by the external input $c_1$. The external input may be a constant voltage or may be an oscillating voltage. If the external input $c_1$ exceeds a certain lower threshold value and does not exceed a certain upper threshold value then the solution to the above equations demonstrates a slow collection of the external input voltage by the neuron and fast release of voltage by the neuron in the excited state. Behaviour of the neuron in this manner may be known as 'integrate and fire'. If the input is below the lower threshold value then the neuron does not fire. If the input is above the upper threshold value then the neuron does not fire. The threshold values are determined by the values 20, −1.2 and −0.3, and may be modified by modifying these values.

Figure 3A:
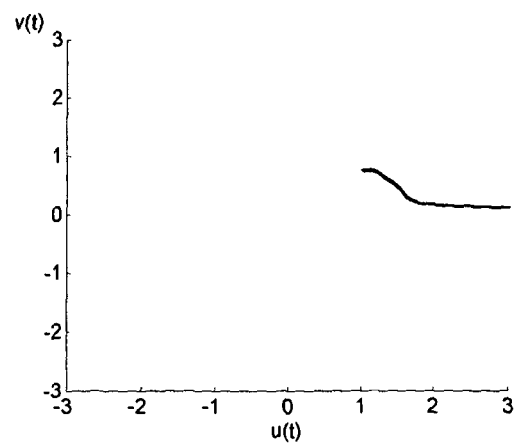
FIGS. 3a, 3b and 3c show the results of a simulation of operation of an oscillator which forms part of the binary half-adder.
Figure 3B:
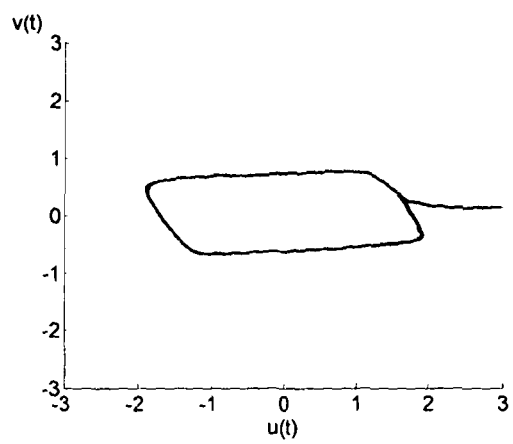
Figure 3C:
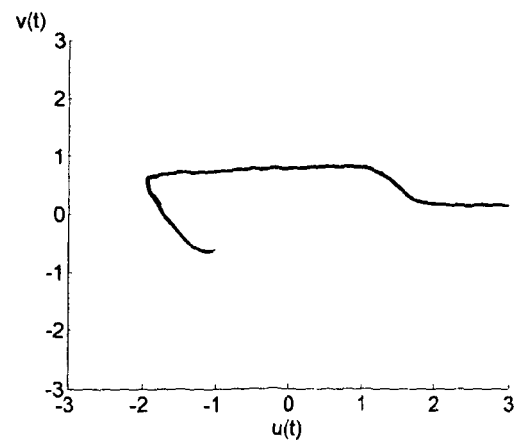

FIGS. 3a-c show the operation of a single Fitzhugh-Nagumo oscillator modelled using Equations 1 and 2. In FIG. 3a, an input $c_1$ applied to the oscillator does not exceed a lower threshold of the oscillator ($c_1 \leq 0.1$). Consequently, the oscillator decays to a stable fixed point (which may also be referred to as a stable critical point). In FIG. 3b, an input is applied to the oscillator which exceeds the lower threshold of the oscillator and does not exceed an upper threshold of the oscillator ($0.1 < c_1 \leq 0.6$). The oscillator thus moves rapidly to a stable limit-cycle oscillation, and stays in that limit-cycle oscillation. In FIG. 3c, an input $c_1$ applied to the oscillator exceeds an upper threshold of the oscillator ($c_1 > 0.6$). Consequently, the oscillator decays to a stable fixed point (which may also be referred to as a stable critical point). The stable critical point to which the oscillator decays when $c_1 \leq 0.1$ may be referred to as the first stable critical point, and the stable point to which the oscillator decays when $c_1 > 0.6$ may be referred to as the second stable critical point. The first and second stable critical points have different values of u and v. The oscillator therefore provides an indication of whether the input $c_1$ was high or low. The oscillator may therefore be considered to be a threshold hysteresis oscillator.

A Fitzhugh-Nagumo oscillator which exhibits the above behaviour may for example be used as the first oscillator 1 shown in FIG. 1. The Fitzhugh-Nagumo oscillator may for example be configured such that it is in a stable limit-cycle oscillation as a result of input values at inputs In1 and In2 but then receives an additional input value at input 30 which pushes the total input above the upper threshold, whereupon the oscillator stops oscillating and decays to the second stable critical point. The input 30 thus acts to suppress oscillation of the oscillator.

In an embodiment the inputs In1, In2 and 30 may be configured such that their combined values are always less than the upper threshold (e.g. less than 0.6 in the above example). Where this is the case the oscillator will decay to the first stable critical point if the external input is below the threshold value, and will move to a stable limit-cycle oscillation if the external input is above the threshold value (the oscillator provides no hysteresis). In an embodiment the values used in the oscillator model may be modified to raise the upper threshold. The connection 30 between the second oscillator 2 and the first oscillator 1 may provide a negative voltage. The negative voltage may be sufficiently large to move the first oscillator 1 below the lower threshold irrespective of the values at the inputs In1, In2. This suppresses oscillation of the first oscillator 1 when the second oscillator 2 is oscillating.

FIGS. 4a-4d show the results of the simulation of the half-adder of FIG. 1 based upon Fitzhugh-Nagumo oscillators. The simulation demonstrates that an oscillating input (e.g. from a preceding oscillator) will give rise to an oscillating output from the binary-half-adder according to the truth table show in Table 1.

Figure 4A:
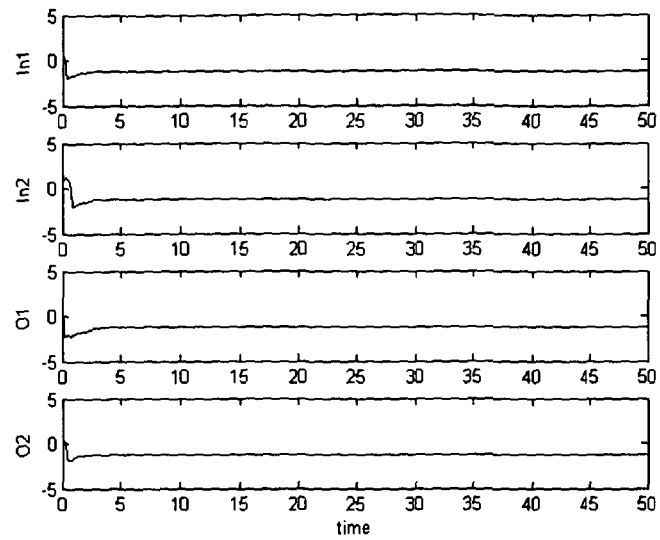
FIGS. 4a-4d show the results of a simulation of operation of the binary half-adder.

Referring first to FIG. 4a, when both of the inputs In1, In2 are low, the outputs Out1, Out2 are also low.

Figure 4B:
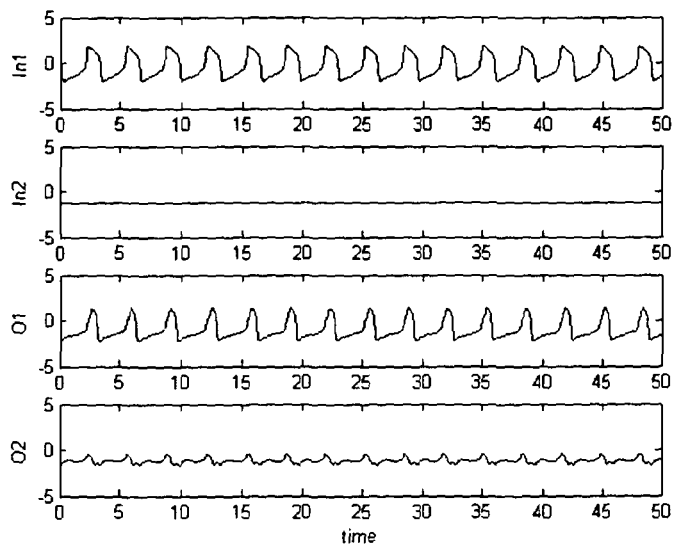

Referring to FIG. 4b, when the first input In1 is high and the second input In2 is low, the first output Out1 is high and the second output Out2 is low. The high signal at the first input In1 is an oscillating signal rather than a continuous signal. This is intended to represent a signal that has been generated by a previous oscillator (which may for example form part of a preceding binary half-adder). It can be seen from FIG. 4b that the second output Out2 is not zero, but instead is an oscillating signal which has a low amplitude and has a power that is below zero. Although the signal is not zero, it is sufficiently small that it may be considered to be equivalent to zero. For example, it will not trigger oscillation of a subsequent oscillator.

Figure 4C:
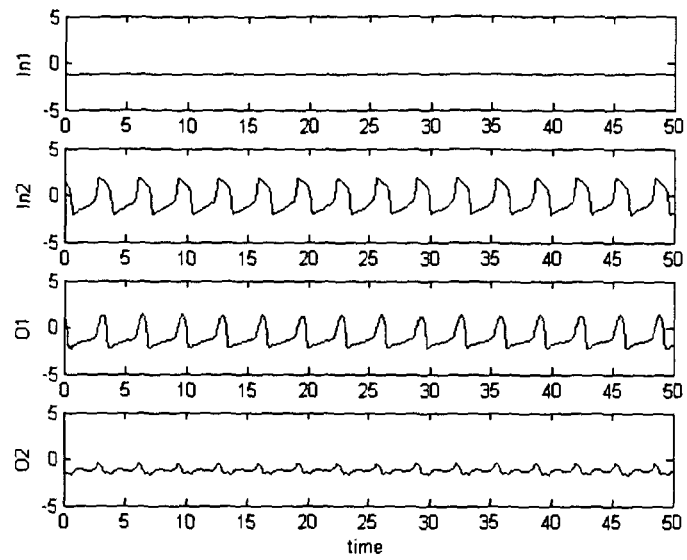

Referring to FIG. 4c, when the first input In1 is low and the second input In2 is high, the first output Out1 is high and the second output Out2 is low. As has been described above in relation to FIG. 4b, the high output signal is an oscillating signal and the low output signal is non-zero but sufficiently low that it may be considered to be equivalent to zero.

Figure 4D:
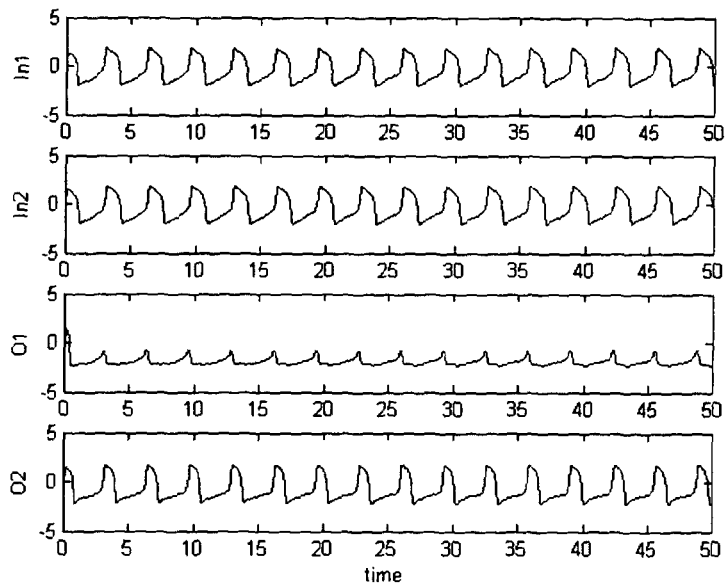

Referring to FIG. 4d, when the first input In1 is high and the second input In2 is high, the first output Out1 is low and the second output Out2 is high. Again, the high output signal is an oscillating signal. The low output signal is non-zero, and has a slightly different form from that seen in FIGS. 4b and 4c. However, the low output signal is sufficiently low that it may be considered to be equivalent to zero.

A neural system may be constructed which operates in the manner described above. The neural system may for example be constructed using two neurons which act as the oscillators shown in FIG. 1, the neurons being connected together in a manner equivalent to that shown in FIG. 1. Each neuron is a limit-cycle oscillator. Neurons require little power and operate at high speed. Suppression of oscillation of the first oscillator 1 by the second oscillator 2 may be via neural hyper-polarization (the neural hyper-polarization passing via the connection 30).

Neurons may be grown on a substrate (e.g. a silicon substrate) using microcontact printing to provide chemical guidance cues. The microcontact printing may be used to deposit a pattern formed in two parts, each part of the pattern providing different guidance cues. A first part of the pattern may comprise neuron adhesion sites and interrupted dendrite guidance lanes. The first part of the pattern may for example be formed on the substrate using poly-L-lysine. A second part of the pattern may comprise uninterrupted wider lanes for axonal development. The second part of the pattern may be formed on the substrate for example using a mixture of poly-L-lysine and laminin. This combination of different guidance cues for dendrite and axon growth may provide controlled neuronal polarity.

Using the microcontact printing technique, it is possible to make a structured neural system and achieve single-cell resolution (i.e. a single cell body adhering to a single site). The microcontact printing technique may for example be used to construct the neural system shown in FIG. 1. Since a pattern printed using microcontact printing may be aligned with a previously provided pattern, the microcontact printing technique allows chemical substances to be printed onto a topographic structured chip surface. The topographic structure of the chip surface may help to keep the neurons in their positions over time. Movement of the neurons may be inhibited by forming walls of the topographic structure from Teflon (available from DuPont of Delaware, USA) or some other suitable material.

Within a neural system, where the oscillators are neurons, each connection between adjacent neurons may take the form of a synapse across which a neurotransmitter diffuses. A signal is sent from one neuron to an adjacent neuron as follows: A synapse exists between the first neuron and a second neuron. A first neuron is excited such that its membrane produces a neurotransmitter. The neurotransmitter produced by the first neuron diffuses across the synapse and interacts with the membrane of the second neuron. The effect that the neurotransmitter produced by the first neuron has on the second neuron depends on both the type of the neurotransmitter produced by the first neuron and the membrane of the second neuron.

In some cases the neurotransmitter produced by the first neuron will interact with the membrane of the second neuron such that the second neuron is excited and fires (this may be considered to be oscillation of the neuron). In the embodiment of the invention shown in FIG. 1, this situation is equivalent to connections 11, 12, 21 and 22 (and the output connections of each of the oscillators 1,2). Examples of neurotransmitters which may excite adjacent neurons include glutamate (glutamic acid) and acetylcholine.

In some cases the neurotransmitter produced by the first neuron will interact with the membrane of the second neuron such that the second neuron is inhibited (or suppressed) from firing. This may be considered to be inhibition of oscillation of the neuron. This situation is equivalent to the connection 30 in the embodiment shown in FIG. 1. An example of a neurotransmitter which may inhibit adjacent neurons is gamma-aminobutyric acid (GABA).

It will be appreciated that a single neuron may be capable of producing and/or interacting with a plurality of different neurotransmitters. The interaction of a neuron with different neurotransmitters may have different effects on the neuron. For example, if the neuron interacts with a first neurotransmitter it may be excited and fire, whereas if the neuron interacts with a second neurotransmitter, the neuron may be suppressed such that it is inhibited from firing.

Different neurotransmitters may diffuse across a synapse at different rates. A neurotransmitter which is produced by a first neuron and diffuses at a relatively fast rate across a synapse to a second neuron may have a greater concentration at the membrane of the second neuron (once it has diffused across the synapse), compared to the concentration of a neurotransmitter which diffuses across the synapse at a relatively slow rate. Neurons which may be used as part of the present invention may be configured such that the concentration of a particular neurotransmitter at the membrane of a neuron must exceed a particular threshold in order for the neurotransmitter to be effective.

In an embodiment, the threshold concentration of a neuron in relation to a particular neurotransmitter may be higher than the concentration of that neurotransmitter after it has diffused across a synapse from a single adjacent neuron. The threshold concentration of the neuron may be lower than the concentration of the neurotransmitter after it has simultaneously diffused across synapses from two separate adjacent neurons. Thus, the threshold concentration of the neuron is not exceeded if one adjacent neuron is in an excited state (and the adjacent neuron is producing the neurotransmitter), but is exceeded if two adjacent neurons are simultaneously in an excited state (and both adjacent neurons are simultaneously producing the neurotransmitter). The neuron therefore functions in a manner which is equivalent to an AND logic gate.

This type of neuron may be used as oscillator 2 in the embodiment of the invention shown in FIG. 1. In this case the neurotransmitter concerned may be one which diffuses across a synapse at a relatively slow rate. The synapses (and neurotransmitter) which link adjacent neurons to the oscillator 2 are equivalent to the connections 12 and 22 in the embodiment shown in FIG. 1. Acetylcholine is an example of a neurotransmitter which may diffuse across a synapse at a relatively slow rate (diffusion coefficient of approximately 1 to $5 \times 10^{-9}$ cm$^2$/sec=approximately 1 to $5 \times 10^{-13}$ m$^2$/sec), and which may be used to provide connections equivalent to connections 12 and 22 in FIG. 1.

In an embodiment, the threshold concentration of another neuron in relation to a particular neurotransmitter may be lower than the concentration of that neurotransmitter after it has diffused across the synapse from a single adjacent neuron. The neuron may be connected by synapses to two adjacent neurons. Each adjacent neuron may generate a neurotransmitter which has a concentration, after it has diffused across a synapse, which is greater than the threshold concentration. Because the threshold concentration of the neuron is such that it is exceeded if either of the adjacent neurons are in an excited state (and either of the adjacent neurons is producing the neurotransmitter), the neuron may function in a manner which is equivalent to an OR logic gate. This type of neuron may be used as oscillator 1 in the embodiment of the invention shown in FIG. 1. In this case the neurotransmitter concerned may be one which diffuses across the synapse at a relatively fast rate. The synapses (and neurotransmitter) which link the oscillator 1 to two adjacent neurons are equivalent to the connections 11 and 21 in the embodiment shown in FIG. 1. Glutamate is an example of a neurotransmitter which may diffuse across a synapse at a relatively fast rate (diffusion coefficient of approximately 0.01 to $1 \times \mu m^2$/msec=approximately 0.01 to $1 \times 10^{-9}$ m$^2$/sec), and which may be used to form connections equivalent to connections 11 and 2a in FIG. 1.

It will be appreciated that for the neuron described in the preceding paragraph to be used as the oscillator 1 in the embodiment shown in FIG. 1, the neuron should be connected to a second neuron (in this case the neuron which may be used as oscillator 2 in the embodiment of the invention shown in FIG. 1) such that when the second neuron is firing, firing of the neuron is inhibited (or suppressed). This may be achieved by the first neuron and second neuron being connected via a synapse, and by the second neuron being capable of producing a neurotransmitter when it is firing which diffuses across the synapse to the first neuron. The neurotransmitter produced by the second neuron may be such that when it interacts with the first neuron it inhibits the first neuron from firing. The neurotransmitter may be a hyper-polarization neurotransmitter. An example of a hyper-polarization neurotransmitter is gamma-Aminobutyric acid (GABA). The combination of the synapse and neurotransmitter which link the second neuron to the first neuron is equivalent to the connection 30 between the first and second oscillators 1,2 of the embodiment shown in FIG. 1. Since the first neuron is inhibited by the second neuron, means that the first neuron may function in a manner which is equivalent to an XOR logic gate (as opposed to functioning as an OR logic gate equivalent).

In an embodiment, binary half-adders may be used to form a programmable biological computer using neurons as described above.

In an alternative embodiment, instead of constructing the binary half-adder of FIG. 1 using neurons and synapses, the binary half-adder is constructed as an electrical circuit (e.g. an integrated circuit on a semiconductor chip). The electrical circuit may for example comprise two Fitzhugh-Nagumo oscillators which are connected together.

Figure 5:
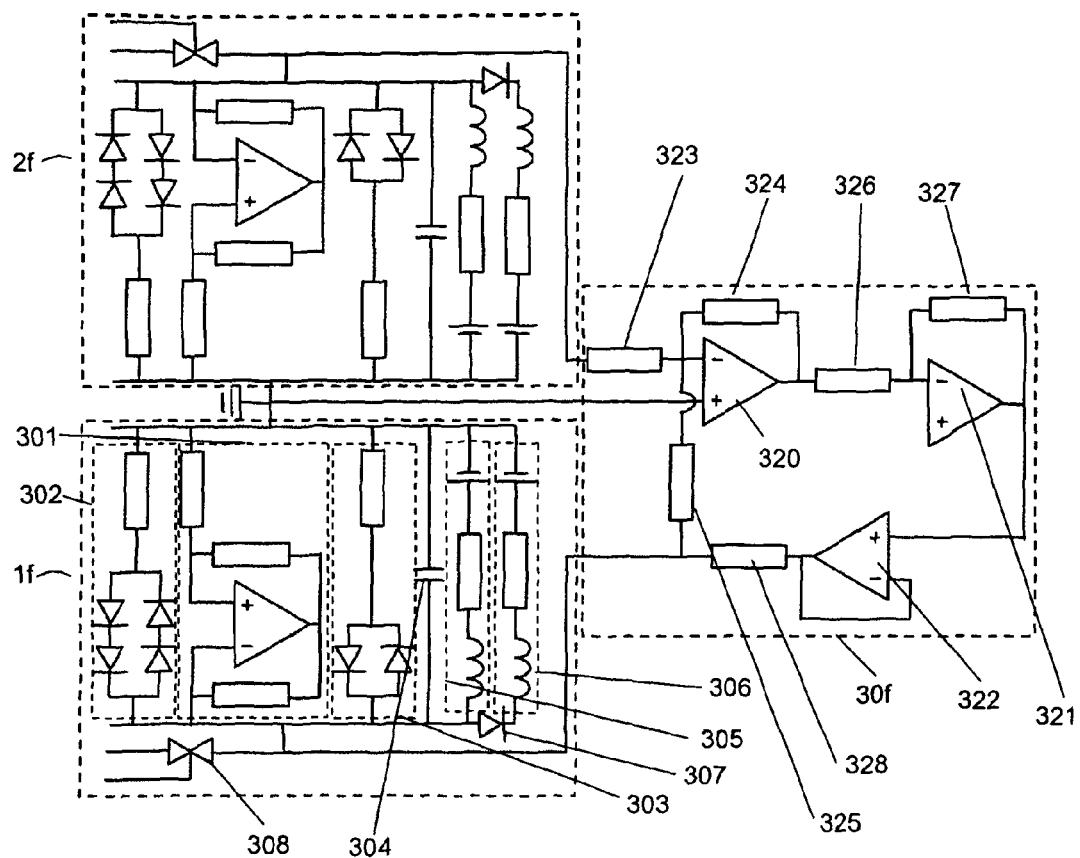
FIG. 5 is a circuit diagram of a binary half-adder formed from Fitzhugh-Nagumo oscillators according to an embodiment of the invention.

FIG. 5 is a circuit diagram which shows the binary half-adder of FIG. 1 constructed using two Fitzhugh-Nagumo oscillators. A first oscillator 1f constructed as a first Fitzhugh-Nagumo oscillator is connected to a second oscillator 2f constructed as a second Fitzhugh-Nagumo oscillator by a connecting circuit 30f. More information regarding Fitzhugh-Nagumo oscillators may be found in S. Binczak et a1 Experimental Study of Electrical Fitzhugh-Nagumo Neurons with Modified Excitability, Neural Networks 19 684 (2006).

The first Fitzhugh-Nagumo oscillator if comprises a negative resistor 301 formed using an operational amplifier, the negative resistor being connected in parallel with two resistive branches 302, 303. Each of the resistive branches 302, 303 is commuted by diodes (e.g. silicon diodes). The negative resistor 301 and resistive branches 302, 303 together comprise a nonlinear resistor. The negative resistor 301 and resistive branches 302, 303 are connected in parallel to a capacitor 304 and two branches 305, 306 which comprise inductances, resistances and voltage sources, and which are commuted by a diode 307 (e.g. a silicon diode). An analogue commutator 308 is controlled by a periodic signal, and determines the state of the oscillator 1f.

The second Fitzhugh-Nagumo oscillator 2f has the same construction as the first Fitzhugh-Nagumo oscillator 1f.

In operation, an input signal is provided to the first Fitzhugh-Nagumo oscillator 1f via the analogue commutator 308. If the input signal exceeds a threshold, then the first Fitzhugh-Nagumo oscillator 1f will oscillate in a stable limit cycle (provided that the input signal does not exceed an upper threshold). If the input does not exceed the threshold, then the first Fitzhugh-Nagumo oscillator 1f will not oscillate. The second Fitzhugh-Nagumo oscillator 2f behaves in the same manner. The threshold is determined by the capacitor 304.

The connecting circuit 30f provides unidirectional coupling from the second Fitzhugh-Nagumo oscillator 2f to the first Fitzhugh-Nagumo oscillator 1f. The connecting circuit 30f comprises an adder-inverter 320 which receives an input signal from the second oscillator 2f, an inverter 321 which receives an input signal from the adder-inverter, and a follower 322 which receives an input signal from the inverter. An output from the follower 322 is connected to the analogue commutator 308 which is connected to an input to the first Fitzhugh-Nagumo oscillator 1f. Various resistors 323-328 are included in the connecting circuit 30f. Three of the resistors 323-325 have a resistance which is higher than the other resistors, for example 100 kΩ. Two of the resistors 326, 327 have a lower resistance, for example 10 kΩ. The remaining resistor 328 is located between the follower 322 and the analogue commutator 308. This resistor 328 controls the strength of coupling between the second Fitzhugh-Nagumo oscillator 2f and the first Fitzhugh-Nagumo oscillator 1f. The resistance of this resistor 328 may be selected based upon the desired degree of coupling between the second Fitzhugh-Nagumo oscillator 2f and the first Fitzhugh-Nagumo oscillator 1f.

Although the above description has referred to the use of Fitzhugh-Nagumo oscillators, other types of oscillator may be used. The oscillators should have the property that they tend towards a stable non-oscillating state in the absence of an external input, and oscillate at a limit-cycle in the presence of an external input which is above a pre-determined threshold. As described further above neurons have this property. Examples of other types of oscillators which behave similarly to neurons (and may be used to implement the invention) include Hodgkin-Huxley oscillators, Morris-Lecar oscillators, Hindmarsh-Rose oscillators, and Josephson-Junction oscillators.

Figure 6:
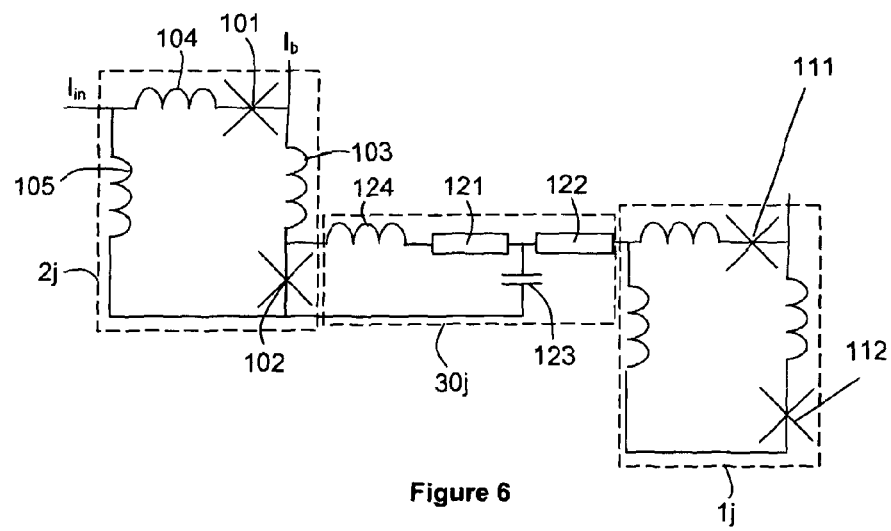
FIG. 6 is a circuit diagram of a binary half-adder formed from Josephson-junction oscillators according to an embodiment of the invention.

FIG. 6 is a circuit diagram which shows two Josephson junction oscillators 1j, 2j connected by a unidirectional hyper-polarising (suppression) link 30j. Each of the Josephson junctions oscillators 1j, 2j is formed from a pair of Josephson junctions 101, 102, 111, 112 which are connected in a superconducting loop (Josephson junctions are indicated as crosses). Each Josephson junction comprises two superconductors separated by an insulating barrier. The insulating barrier may be thin enough to allow current and/or voltage to pass between the superconductors. The insulating barrier may for example be 1 nm thick, or may have some other suitable thickness. Electrons in each of the superconductors behave according to a coherent wave function with a definite phase. The phase difference from one side of the barrier to the other is referred to as the Josephson phase, and controls all of the electrical properties of the junction. More information regarding Josephson-Junctions may be found in P. Crotty et a1, Josephson Junction Simulation of Neurons; Phys Rev. E 82(1), 011914 (2010).

As can be seen from FIG. 6, the second Josephson junction oscillator 2j comprises a first Josephson junction 101 and a second Josephson junction 102. An inductor 103 is provided between the first and second Josephson junctions 101, 102. A bias current input $I_b$ provides bias current to each of the Josephson junctions 101, 102. An input $I_{in}$ receives an input signal, which may for example be generated by another oscillator. The input $I_{in}$ is connected via a first input inductor 104 to the first Josephson junction 101, and is connected via a second inductor 105 to the second Josephson junction 102. The Josephson junctions 101, 102 and the inductors 103-105 together form a loop which establishes the Josephson junction oscillator 2j. An output is connected across the second Josephson junction 102, the output being the unidirectional link 30j.

In use, the bias current input $I_b$ provides current to the Josephson junctions 101, 102 which is not sufficient to move the Josephson junctions to whirling states (the whirling state is an excited state of a Josephson junction, as will be understood by those skilled in the art). When the input current $I_{in}$ is sufficiently high, the current at the second Josephson junction 102 causes the second Josephson junction to enter a whirling state. A voltage appears across the second Josephson junction 102, thereby providing an output voltage to the unidirectional link 30j. The voltage across the second Josephson junction 102 creates magnetic flux in the loop (i.e. the Josephson junction oscillator 2j) which is analogous to a neuron's membrane potential rising. The magnetic flux induces current in the loop, and this current moves the first Josephson junction 101 towards a whirling state. When the first Josephson junction 101 enters the whirling state, flux is drained from the loop and the second Josephson junction 102 thus relaxes from the whirling state. The first Josephson junction 101 also relaxes from the whirling state. This begins a period during which it is extremely difficult to initiate whirling of the second Josephson junction 102. At the end of this period, if the input current $I_{in}$ remains high, then the second Josephson junction 102 will again enter the whirling state. The process of the second Josephson junction 102 whirling, stopping whirling, whirling again, etc will continue indefinitely whilst the input $I_{in}$ is high. This provides a limit cycle oscillation of the output voltage across the second Josephson junction 102. Thus, the first and second Josephson junctions 101, 102 together with the inductors form a Josephson junction oscillator 2j which acts as a limit cycle oscillator. When the input current $I_{in}$ is switched off, then sufficient current is no longer available to initiate whirling of the second Josephson junction 102 once whirling has been stopped by the first Josephson junction 101. The Josephson junction oscillator 2j thus stops oscillating.

The first Josephson junction oscillator 1j has the same construction as the second Josephson junction oscillator 2j.

The connecting circuit 30j connects the second Josephson junction oscillator 2j to the first Josephson junction oscillator 1j. The connecting circuit may act as an inhibitory connecting circuit, which acts to prevent the first Josephson junction oscillator 1j from oscillating if the second Josephson junction oscillator 2j is oscillating. The circuit 30j which connects the first and second Josephson junction oscillators 1j is a resonant circuit formed from two resistors 121, 122, a capacitor 123 and an inductor 124. The capacitor 123 is connected across the second Josephson junction 102 of the second Josephson junction oscillator 2j, and is connected between the resistors 121, 122. The inductor 124 is connected between the first resistor 121 and the second Josephson junction 102 of the second Josephson junction oscillator 2j. An output from the second resistor 122 is connected to an input of the first Josephson junction oscillator 1j.

In operation, the effect of the connecting circuit 30j depends upon the sign of the bias current $I_b$ provided to the second Josephson junction oscillator 2j. If the bias current is negative then the connecting circuit 30j is inhibitory (provides a hyper-polarization connection), such that the first Josephson junction oscillator 1j will not oscillate if the second oscillator Josephson junction 2j is oscillating. This configuration may be used by embodiments of the invention. If the bias current is positive, then oscillation of the second Josephson junction oscillator 2j will cause the first Josephson junction oscillator 1j to oscillate.

Other connecting circuits may be used to provide an inhibitory connection between the second Josephson junction oscillator 2j and the first Josephson junction oscillator 1j.

Josephson junctions are commercially available from HYPRES, Inc. of New York, USA. HYPRES provide integrated circuits having a multiplicity of Josephson junctions (e.g. 20,000 Josephson junctions) which operate at 10 mW. A binary half-adder comprising Josephson junctions as shown in FIG. 6 may therefore be implemented in an integrated circuit. A multiplicity of binary half-adders may be implemented in an integrated circuit.

Figure 7:
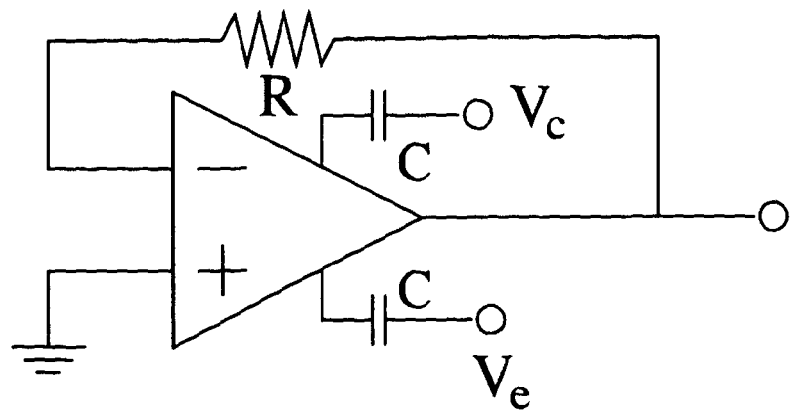
FIG. 7 is a circuit diagram of an oscillator which may form part of an embodiment of the invention.

In other embodiments of the invention other limit cycle oscillators may be used (e.g. standard CMOS oscillators). In an embodiment an operational amplifier configured to oscillate may be used. An example of such a configuration is shown in FIG. 7. More information regarding this form of oscillator may be found in C. M. Kim et al, Excitable Behaviour of an Operational Amplifier, Europhys. Lett. 71 723 (2005).

In an embodiment, oscillators formed from Schmidt triggers may be used. The Schmidt trigger is a bistable multivibrator which may be used to implement a relaxation oscillator. An example of a Schmidt trigger oscillator is shown in FIG. 8.

FIG. 9 shows a simulation of two oscillators with an inhibitory (neural hyper-polarization) connection between them, which may form part of an embodiment of the present invention. The simulation, which was generated using Simulink software, provides binary half-adder operation.

Referring to FIG. 9, first and second oscillators 1s, 2s are connected by an inhibitory connection 30s. The first and second oscillators 1s, 2s are Fitzhugh-Nagumo oscillators modelled using equations 1 and 2 (see above). Two inputs $I_{n1s}$ and $I_{n2s}$ provide input signals which are combined together by an adder A1. The first oscillator 1s is connected to the combined inputs by a low resistance connection R1 (represented here by an amplifier with a gain of 0.3). The second oscillator 2s is connected to the combined inputs via a high resistance connection R2 (represented here by an amplifier with a gain of 0.1).

Each input $I_n1_s$, $I_n2_s$ has a value of 1 when that input is high and has a value of 0 when that input is low. The resistance of the high resistance connection R2 is such that the threshold of the second oscillator 2s is only reached if both the first and second inputs $I_n1_s$, $I_n2_s$ are high. If only one input (e.g. $I_n1_s$) is high then the output from the high resistance connection R2 is 0.1. This is not sufficient to cause the second oscillator 2s to oscillate (an input which exceeds 0.1 is required). If both inputs $I_n1_s$, $I_n2_s$ are high then the output from the high resistance connection R2 is 0.2. This exceeds the threshold 0.1 and as a result the oscillator 2s oscillates.

The resistance of the low resistance connection R1 is such that the threshold of the first oscillator 1s is reached if either the first input $I_n1_s$ or the second input $I_n2_s$ is high (the output is 0.3 which exceeds the threshold of 0.1). The first oscillator 1s has an upper threshold of 0.6 and will cease oscillating if this threshold is exceeded. The output of the low resistance connection R1 is 0.6 if both the inputs $I_n1_s$, $I_n2_s$ are high. Since this does not exceed the upper threshold of the first oscillator 1s, the first oscillator will oscillate when both of the inputs $I_n1_s$, $I_n2_s$ are high.

The connection 30s provides a unidirectional connection from the second oscillator 2s to the first oscillator 1s. The connection receives an output from the second oscillator 2s which is 0 when the second oscillator is oscillating, and which is 1 when the second oscillator is not oscillating. The connection 30s comprises an operator which is configured to determine the absolute value of an input minus 1 (the input being an output received from the second oscillator 2s). Thus, if the input to the connection 30s is 0 then the output from the connection is 1. If the input to the connection 30s is 1 then the output from the connection is 0. Therefore, if the second oscillator 2s is oscillating then the connection 30s provides an output of 1. If the second oscillator is not oscillating then the operator OP provides an output of 0. The output of the connection 30s is indicated as C2. The output C2 of the connection 30s is combined by an adder A2 with the output from the low resistance connection R1.

If the output from the connection 30s is high then the input to the first oscillator 1s will be 1 or greater (1.3 if one of the inputs $I_n1_s$, $I_n2_s$ is high, 1.6 or both of inputs are high). Since this exceeds the threshold of 0.6 the first oscillator 1s will not oscillate. Thus, if the second oscillator 2s is oscillating then the effect of the connection 30s is to inhibit oscillation of the first oscillator 1s. If the output from the connection 30s is low then the inputs to the first oscillator 1s will be entirely determined by the inputs $I_n1_s$, $I_n2_s$. Thus, when the second oscillator 2s is not oscillating, then a high value at either input $I_n1_s$, $I_n2_s$ causes the first oscillator 1s to oscillate. However, when the second oscillator 2s is oscillating, then the first oscillator is prevented from oscillating, irrespective of the value at the first input C1. This provides the second oscillator 2s with the XOR functionality that is required by the binary half-adder.

An advantage of binary-half-adders according to embodiments of the invention is that they may require considerably less energy to operate than binary-half-adders formed in the conventional way using transistors. This is because the amount of energy required to move an oscillator to the limit-cycle state is relatively small.

An additional advantage of binary half-adders according to embodiments of the invention is that their wiring may be simpler than that of binary-half-adders formed in the conventional way using transistors.

An additional advantage of binary half-adders according to embodiments of the invention is that they may provide faster operation than conventional binary half-adders. The speed of operation of a binary half-adder according to an embodiment of the invention will depend upon the cycle time of the oscillators 1,2. The cycle time of an oscillator is often dependent upon the power supplied to the oscillator. Thus, the cycle time may be reduced by increasing the power. Although increasing the power supplied to the oscillators would increase the power consumption of the binary half-adder, it may nevertheless be the case that the power consumption remains less than that of an equivalent binary half-adder formed from transistors in a conventional manner. The power consumption of the oscillators may be reduced by reducing the size of the components used to form the oscillators.

A Simulation Program with Integrated Circuit Emphasis (SPICE) has been used to design an integrated digital circuit which provides binary half-adder functionality according to an embodiment of the invention.

FIG. 10 is a high level representation of the integrated circuit designed using the SPICE simulator. The integrated circuit comprises a first oscillator circuit 1 and a second oscillator circuit 2. The first and second oscillator circuits have behaviour which corresponds with the behaviour of the oscillators shown in FIG. 1. A first input A and a second input B is connected to the first and second oscillators 1,2 (these correspond respectively to the inputs In1 and In2 shown in FIG. 1). An output Vout from the second oscillator 2 is connected as input C of first oscillator 1 (this corresponds to the connection 30 shown in FIG. 1). An output Out1 is taken from the first oscillator 1 and an output Out2 is taken from the second oscillator 2. A supply voltage Vdd of 1.2V is supplied to the first and second oscillator circuits 1,2 (other voltages may be used).

FIG. 11 is a component level representation of the first oscillator circuit 1 shown in FIG. 10. The first oscillator circuit 1 comprises a multiplicity of FETs (e.g. MOSFETs) Q1-020. Some of the FETs Q1, Q3, Q5, Q7, Q9-10, Q13-14, Q17-18 are PFETs and are arranged such that they are switched on when their gates are connected to a low voltage (e.g. connected to ground). Other FETs Q2, Q4, Q6, Q8, Q11-12, Q15-16, Q19-20 are NFETs and are arranged such that they are switched on when their gates are connected to a high voltage (e.g. connected to the supply voltage Vdd). To facilitate clear explanation of the first oscillator circuit 1, the first oscillator circuit is separated into different parts by dotted lines.

The first part of the first oscillator circuit 1 is an oscillator 101. The oscillator 101 comprises six FETs Q1-06 which are arranged as three inverters connected in series with one another. A first inverter 102 comprises a PFET Q1 connected in series with an NFET Q2 between the supply voltage Vdd and ground. The gates of the FETs Q1, Q2 are connected together and comprise an input of the inverter 102. When the input is high NFET Q2 is switched on and PFET Q1 is switched off, and as a result the output of the inverter is connected to ground. When the input is low PFET Q1 is switched on and NFET Q2 is switched off, and as a result the output of the inverter 102 is connected to the supply voltage Vdd. The FETs Q1, Q2 thus invert an input signal and therefore act as an inverter.

A second inverter 103 comprises a pair of FETs Q3, Q4 provided in the same configuration as the first inverter 102. The second inverter 103 operates in the same manner as the first inverter 102. A third inverter 104 also comprises a pair of FETs Q5, Q6 provided in the same configuration as the first inverter 102. The third inverter 104 operates in the same manner as the first inverter 102. Since an odd number of inverters 102-104 is provided, the output from the third inverter 104 is opposite to the input at the first inverter 102.

Three inverters 102-104 are used rather than one inverter because the gain provided by the FETs is relatively low (the FETs are not designed to operate as amplifiers). The three inverters together provide gain which is sufficiently high to allow the oscillator 101 to operate correctly in the presence of noise. In an embodiment, the oscillator 101 may comprise five inverters, seven invertors or some other suitable odd number of inverters.

The output from the third inverter 104 is connected to the input of the first inverter 102. This connection from the output of the third inverter 104 to the input of the first inverter 102 causes the three inverters 102-104 to oscillate between the supply voltage Vdd and ground (i.e. to act as an oscillator). The frequency of oscillation is determined by a propagation delay through the invertors Vdd.

Although the oscillator 101 will oscillate continuously irrespective of values at inputs A, B, C of the first oscillator circuit 1, the signal seen at the output Out1 of the first oscillator circuit 1 is governed by the values at those inputs, as is explained below.

The input C of the first oscillator circuit 1 corresponds with the input 30 shown in FIG. 1 and is an inhibitory input. Thus, when the input C is high the output Out1 of the first oscillator circuit 1 should be low. When the input C is low the output Out1 of the first oscillator circuit 1 should oscillate between high and low if either input A or input B are high. This functionality, excluding the effect of inputs A and B, is provided by six FETs Q7-Q12.

A second part of the first oscillator circuit 1 is a pair of FETs Q7, Q8 which are connected in series to form an inverter 105. The inverter 105 provides NOT logic, i.e. provides an output signal which is opposite to the signal at the input C.

A third part of the first oscillator circuit 1 is four FETs Q9-Q12 which are connected such that they form a NAND circuit 106 which provides NAND logic. The inputs to the NAND circuit 106 are the output from the inverter 105 and the output from the oscillator 101. If the input received by the NAND circuit 106 from the inverter 105 is low (i.e. the input C is high) then the output from the NAND circuit is high. This applies irrespective of whether the input received from the oscillator 101 is high or low. This is because PFET Q9 is switched on and connects the output of the NAND circuit 106 to the supply voltage Vdd irrespective of the state of the input received from the oscillator 101.

If the input received by the NAND circuit 106 from the inverter is high (i.e. the input C is low) then the output from the NAND circuit will depend upon the signal received from the oscillator 101. NFET Q11 is switched on, but this FET is not directly connected to ground and is instead connected to ground via NFET Q12. An input to NFET Q12 receives the output from the oscillator 101. When the output from the oscillator 101 is high NFET Q12 is switched on, thereby connecting the output of the NAND circuit 106 to ground via NQ11 and NQ12. When the output from the oscillator 101 is low, NFET Q12 is switched off but PFET Q10 is switched on, thereby connecting the output of the NAND circuit 106 to the supply voltage Vdd. Thus, when the input C is low, the NAND circuit 106 provides an oscillating output which is opposite in phase to the output of the oscillator 101.

The combined effect of the oscillator 101, inverter 105 and NAND circuit 106 is to provide a high output if the input C is high, and to provide an oscillating output if the input C is low. The remainder of the oscillator circuit 1 combines this logic with logic arising from the inputs A and B.

A fourth part of the first oscillator circuit 1 comprises four FETs Q13-16 which are configured as a NOR circuit that receives inputs A and B and provides an output according to NOR logic. A pair of PFETs Q13, Q14 are connected in series to the voltage supply Vdd. A pair of NFETs Q15, Q16 are connected in parallel to ground. When both inputs A and B are high, PFETs Q13 and Q14 are switched off and NFETs Q15 and Q16 are switched on. The output from the NOR circuit 107 is therefore connected to ground. When both inputs A and B are low, PFETs Q13 and Q14 are switched on and NFETs Q15 are Q16 are switched off. The output from the NOR circuit 107 is therefore connected to the voltage supply Vdd. If input A is high and input B is low then FETs Q13 and Q15 are switched on and FETs Q14 and Q16 are switched off. Since PFET Q13 is connected in series with PFET Q14 (which is switched off) the output from the NOR circuit 107 is not connected to the voltage supply Vdd. However, since NFET Q15 is connected in parallel with NFET Q16, the output from the NOR circuit 107 is connected to ground even though NFET Q16 is switched off. Thus, the output from the NOR circuit 107 is low when input A is high and input B is low. Similarly, if input A is low and input B is high then FETs Q13 are Q15 are switched off and FETs Q 14 and Q16 are switched on. The output from the NOR circuit 107 is thus connected to ground via NFET Q16. The logic provided by the NOR circuit 107 is thus that the output is high if both inputs A and B are low, and the output is low if either input A or input B is high.

A final part of the first oscillator circuit 1 comprises four FETs Q17-20 which are also configured as a NOR circuit 108. The NOR circuit 108 has the same configuration as the NOR circuit 107 described above. The NOR circuit 108 receives as inputs the output from the NAND circuit 106 and the output from the NOR circuit 107. The logic provided by the NOR circuit 108 is that the output is high if both inputs are low, and the output is low if either input is high.

As has been explained further above, the output from the NAND circuit 106 is high if input C is high. Where this is the case, NFET Q20 is switched on thereby connecting the output of the NOR circuit 108 (and hence the output Out1 of the oscillator circuit 1) to ground. This provides the oscillator circuit 1 with the inhibitory functionality referred to further above. That is, the oscillator circuit 1 cannot provide a high output if input C is high.

As has been explained further above, the output from the NAND circuit 106 oscillates if input C is low. Where this is the case the NOR circuit 108 oscillates between a first state in which PFET Q17 is switched on and NFET Q20 is switched off, and a second state in which PFET Q17 is switched off and NFET Q20 is switched on. When the NOR circuit 108 is in the second state its output is connected to ground. When the NOR circuit 108 is in the first state its output may be connected to the voltage supply Vdd, but will only be so connected if PFET Q18 is switched on. PFET Q18 is governed by the output of NOR circuit 107 and is switched on if the output from the NOR circuit 107 is low. This will be the case if either input A or input B is high. Therefore, if either input A or input B is high, and input C is low, the NOR circuit 108 will oscillate between the first state in which its output Out1 is connected to the supply voltage Vdd (via PFETs Q17 and Q18) and the second state in which its output Out1 is connected to ground (via NFET Q20). The first oscillator circuit 1 thus provides an oscillating output Out1.

If neither input A nor input B are high then NFET Q19 is switched on and the first oscillator circuit 1 thus provides a zero output. The first oscillator circuit 1 provides an oscillating output according to the logic: (A OR B) NOT C.

FIG. 12 is a component level representation of the second oscillator circuit 2 shown in FIG. 10. The second oscillator circuit 2 comprises a multiplicity of FETs Q21-Q39, two resistors R1, R2 and a capacitor C1. Some of the FETs Q21, Q23, Q25, Q27, Q29-32, Q37, Q38 are PFETs and are arranged such that they are switched on when their gates are connected to a low voltage (e.g. connected to ground). Other FETs Q22, Q24, Q26, Q28, Q33-36, Q39 are NFETs and are arranged such that they are switched on when their gates are connected to a high voltage (e.g. connected to the supply voltage Vdd). To facilitate clear explanation of the second oscillator circuit 2, the second oscillator circuit is separated into different parts by dotted lines.

A first part of the second oscillator circuit 2 is an oscillator 201 constructed using six FETs Q21-Q26. The FETs Q21-Q26 are arranged as three inverters 202-204 which are connected together in series. The construction of the oscillator 201 is the same as the oscillator 101 in described above in relation to FIG. 11, and the oscillator operates in the same manner.

A second part of the second oscillator circuit 2 is an inverter 205 formed from two FETs Q27, Q28 connected in series. The inverter 205 has the same construction as the inverter 105 described above in relation to FIG. 11 and operates in the same manner. The inverter 205 provides an output which is opposite to an input received at input C.

The next part of the second oscillator circuit 2 is a NAND circuit 206. The NAND circuit 206 comprises four PFETs Q29-Q32 connected in parallel to the supply voltage Vdd and four NFETs Q33-Q36 connected in series to ground. The four PFETs Q29-Q32 connected to the supply voltage Vdd have gates which are respectively connected to input B, input A, the output from the oscillator 201, and the output from the inverter 205. The four NFETs Q33-36 connected in series to ground have gates which are respectively connected to the output from the inverter 205, input B, input A, and the output from the oscillator 201. Due to the parallel connection of PFETs Q29-Q32 to the supply voltage Vdd, the NAND circuit 206 will generate a high output if any of input A, input B, the output from the inverter 205 or the output from the oscillator 201 are low. Due to the series connection of NFETs Q33-Q36 to ground, the NAND circuit 206 will only generate a low output if all of input A, input B, the output from the inverter 205 or the output from the oscillator 201 are high.

If the input C is high then this will be converted to a low output by the inverter 205. Since the NAND circuit 206 is receiving a low input it will generate a high output. If the input A or the input B is low then the NAND circuit 206 will similarly generate a high output. However, if the input A and the input B are both high and the input C is low, then the output of the NAND circuit 206 will be governed by the output of the oscillator 201. When the output of the oscillator is high then NFET Q36 will be switched on and PFET Q 31 will be switched off. All four NFETs Q33-Q36 are thus switched on (and all four PFETs Q29-Q32 are switched off), and the NAND circuit 206 generates a low output. When the output of the oscillator is low then NFET Q36 will be switched off and PFET Q31 will be switched on. There is therefore no longer a connection between the output of the NAND circuit 206 and ground but there is a connection between the output and the supply voltage Vdd. The NAND circuit 206 thus generates a high output.

Therefore, when the NAND circuit is governed by the oscillator 201 it generates an output which oscillates and is opposite in phase to the oscillator output.

The final part of the second oscillator circuit 2 is an inverter 208 (a penultimate part 207 of the second oscillator circuit 2 is described further below). The inverter 208 comprises two FETs Q38, Q39 which are connected in series. The inverter 208 inverts an input signal to provide output Out2. Taking into account the other parts of the second oscillator circuit 2 described above, the output Out2 is low if either of inputs A and B are low or if input C is high. The output Out2 oscillates if inputs A and B are high and if input C is low. The second oscillator circuit 2 provides an oscillating output according to the logic: (A AND B) NOT C. This is the logic required by the second oscillator 2 shown in FIG. 1.

The penultimate part of the second oscillator circuit 2 comprises a conversion circuit 207 comprising a PFET Q37, a pair of resistors R1, R2 and a capacitor C1. The conversion circuit 207 converts an oscillating input to a constant (or substantially constant) high output, and provides a low output when the input is low. The first resistor R1 has a resistance of 100 kΩ and the second resistor R2 has a resistance of 1 MΩ. The capacitor C1 has a capacitance of 10 femtofarads. The resistors R1, R2 are arranged in series, the second resistor R2 being connected to ground and the first resistor R1 being connected to a collector of the PFET Q37. The emitter of the PFET Q37 is connected to the supply voltage Vdd. The capacitor C1 is connected in parallel with the second resistor R2. The capacitor C1 and resistors R1, R2 may have other suitable values.

When the output from the NAND circuit 206 is low the PFET Q37 is switched on, thereby connecting the first resistor R1 to the supply voltage Vdd. Current therefore flows through the resistors R1, R2. Since the resistance of the first resistor R1 is a tenth of the resistance of the second resistor R2, the voltage between the resistors is close to the supply voltage Vdd. In practice, due to the operation of the NAND circuit 206, the input to the detection circuit 207 will never be constantly low, but instead will either be high or will oscillate between high and low. The capacitor C1 acts to smooth the oscillation between high and low such that the output connection Vout has a value which remains high when the input to the conversion circuit 207 is oscillating. When the input to the conversion circuit 207 is high the PFET Q37 is switched off. The capacitor C1 discharges through the resistor R2 and the voltage at the output connection Vout therefore drops to ground. The output connection Vout is therefore high if inputs A and B are high and input C is low, and is low if either of inputs A and B are low or if input C is high. The output connection Vout is used as the input C for the first oscillator 1 (as shown in FIG. 10).

Referring to FIG. 12 in combination with FIG. 10, it may be seen that the input C of the second oscillator 2 is connected to ground. Since input C of the second oscillator 2 is always low, the output Out2 of the second oscillator will oscillate if both of inputs A and B are high.

FIG. 13 is a set of graphs which have been generated using the SPICE simulated circuits shown in FIGS. 10-12. Input A and input B, both of which are connected to the first oscillator circuit 1 and the second oscillator circuit 2, are shown together with respective outputs Out1 and Out2 of the first oscillator circuit and the second oscillator circuit. The inputs and outputs are shown as voltages plotted as a function of time (a total time of 100 ns is shown in FIG. 13).

At zero time both input A and input B are low and outputs Out1 and Out2 are also low. At around 10 ns input A goes high whilst input B remains low. Output Out1 begins to oscillate and output Out2 remains low. This is as desired, since the output of the first oscillator circuit 1 should oscillate if one of the inputs A,B goes high, whereas the output of the second oscillator circuit 2 should remain low. A first oscillation of the output Out1 has an intermediate amplitude, but subsequent oscillations of the output Out1 have a full amplitude (this is because the first oscillator circuit 1 has a finite start up time).

At around 20 ns input A goes low and input B goes high. This does not cause any change in the outputs. Output Out1 continues to oscillate and output Out2 remains low. This is as desired, since the output of the first oscillator circuit 1 should continue to oscillate if one of the inputs A,B is high, whereas the output of the second oscillator circuit 2 should remain low.

At around 30 ns input A goes high whilst input B remains high. This causes the output Out2 to begin oscillating and causes the output Out1 to go low. This is as desired: the output of the second oscillator circuit 2 should oscillate if both input A and input B are high, and the output of the first oscillator circuit 1 should go low if both input A and input B are high. Two oscillations of the output Out1 of the first oscillator circuit 1 occur after input A has gone high. This is primarily because it takes a finite time for the conversion circuit 207 to produce a high output once it has received an oscillating input. As may be seen from FIG. 13 the frequency of oscillation is around 5 ns. This frequency is determined by the propagation delay through the invertors 102-104, 202-204. It may be modified by changing the number of invertors. Alternatively, it may be changed by adding resistors and capacitors. In VLSI circuits it may be preferable to use the number of invertors to change the propagation rather than adding resistors and capacitors.

As may be seen from FIG. 10 the input C of the second oscillator circuit 2 is not used by the binary half-adder (it is connected to ground). However, the input C may be used when more complex configurations of oscillators are constructed (for example the full adder described below in relation to FIG. 14).

An integrated circuit which corresponds with that shown in FIGS. 10-12 may be fabricated in a conventional manner. The integrated circuit may for example be fabricated using a lithographic apparatus which provides a resolution (critical dimension) of around 90 nm. The integrated circuits may for example be fabricated with some other resolution.

Although the outputs Out1, Out2 of the first and second oscillators circuits 1,2 are oscillating outputs, in an embodiment the first and second oscillators may be configured such that they provide constant (or substantially constant) outputs instead of oscillating outputs. This may be done for example by using conversion circuits similar to the conversion circuit 207 shown in FIG. 12 (or other suitable conversion circuits). An advantage of providing constant or substantially constant outputs is that this avoids the need to take phase into account when connecting oscillators together.

The first and second oscillator circuits 1,2 shown in FIGS. 11 and 12 are merely examples of oscillator circuits which may form part of an embodiment of the invention and which may be implemented as an integrated circuit. Other oscillator circuits may be used and may be implemented as integrated circuits.

A multiplicity of binary half-adders according to the invention may be used to form a computer processor by combining the half-adders together in a known manner. FIG. 14 is a schematic illustration of five oscillators 3-7 which are configured to operate as a binary adder in accordance with an embodiment of the invention. The oscillators may be of any of the types previously discussed. A first input In3 passes via connections 37 and 33 to oscillator 7 and oscillator 3 respectively. The connection 33 has a low resistance, and the connection 37 has a high resistance. This is shown schematically in FIG. 14 by indicating the connection 33 as a thick line and the connection 37 as a thin line. A second input In4 passes via connections 47 and 43 to oscillators 7 and 3 respectively. The connection 43 has a low resistance, and the connection 47 has a high resistance (again indicated by a thick line and a thin line respectively). A connection 70 extends between the oscillator 7 and the oscillator 3. Oscillators 7 and 3 thus form a first half-adder. A third input In5 passes via connections 54 and 55 to oscillator 4 and oscillator 5 respectively. The connection 54 has a low resistance, and the connection 55 has a high resistance (again indicated by a thick line and a thin line respectively). The output of oscillator 3 passes via connections 34 and 35 to oscillators 4 and 5 respectively. The connection 34 has a low resistance, and the connection 35 has a high resistance (again indicated by a thick line and a thin line respectively). A connection 50 extends between the oscillator 5 and the oscillator 4. Oscillators 4 and 5 thus form a second half-adder, connected to the first half-adder. The outputs of oscillators 5 and 7 pass via connections 56 and 76 respectively to a further oscillator 6. Both connections 56 and 76 have a low resistance (indicated by thick lines). Thus, the oscillator 6 is connected to both the first and second half-adders to form an adder.

In a similar manner to connection 30 of the embodiment shown in FIG. 1, connection 50 ensures that when oscillator 5 is oscillating, the oscillation of oscillator 4 is suppressed. Similarly, connection 70 ensures that when oscillator 7 is oscillating, the oscillation of oscillator 3 is suppressed.

Within the embodiment shown in FIG. 14 the nature of the inputs, the connections between inputs and oscillators, and the connections between oscillators and other oscillators determine whether the oscillators oscillate or not in a similar manner to the embodiment shown in FIG. 1.

Table 2 is a truth table for the oscillators shown in FIG. 14. The truth table reflects the above description, and demonstrates that the oscillators 3-7 act as a binary adder.

TABLE 2

| In3 | In4 | In5 | Out4 | Out3 |
|-----|-----|-----|------|------|
| 0 | 0 | 0 | 0 | 0 |
| 1 | 0 | 0 | 0 | 1 |
| 0 | 1 | 0 | 0 | 1 |
| 0 | 0 | 1 | 0 | 1 |
| 1 | 1 | 0 | 1 | 0 |
| 1 | 0 | 1 | 1 | 0 |
| 0 | 1 | 1 | 1 | 0 |
| 1 | 1 | 1 | 1 | 1 |

FIG. 15 shows a logic gate configuration which operates in an equivalent manner to the oscillators 3-7. Logic gate 3a is an XOR gate which is equivalent to oscillator 3. Logic gate 4a is an XOR gate which is equivalent to oscillator 4. Logic gate 5a is an AND gate which is equivalent to oscillator 5. Logic gate 6a is an OR gate which is equivalent to oscillator 6. Logic gate 7a is an AND gate which is equivalent to oscillator 7. Equivalent connections, inputs and outputs have been given the same numbering in FIGS. 5 and 6.

FIG. 16 shows schematically a binary adder which may be constructed using three oscillators B1-3 in accordance with an embodiment of the invention. The oscillators may be of any of the types previously discussed. The binary adder is provided with three inputs In3-5, each of which is connected to each oscillator B1-3. A first output Out3 is connected to the first oscillator B1. A second output Out4 is connected to both the second and third oscillators B2, B3. The binary adder may be considered to comprise a binary half-adder (formed from the first and second oscillators B1, B2) and an additional oscillator B3.

Each of the oscillators B1-3 has a different threshold. The threshold of the first oscillator B1 is set such that the first oscillator B1 will oscillate if any of the three inputs In3-5 has a high value. The second oscillator B2 has a threshold which is set such that it will oscillate if any two of the three inputs In3-5 have high values. The threshold of the third oscillator B3 is set such that it will only oscillate if all three of the inputs In3-5 have high values.

A unidirectional inhibitory connection 80 is connected from the third oscillator B3 to the second oscillator B2. A unidirectional inhibitory connection 90 extends from the second oscillator B2 to the first oscillator B1. The effect of the inhibitory connections 80, 90 is such that the second oscillator B2 will not oscillate if the third oscillator B3 is oscillating, and is such that the first oscillator B1 will not oscillate if the second oscillator B2 is oscillating.

In operation, if only one of the three inputs In3-5 is high, then only the threshold of the first oscillator B1 will be exceeded. The first oscillator B1 will thus oscillate and provide a high output at output 3. The second and third oscillators B2, B3 will not oscillate, and the output at output 4 will remain low.

If the first and second inputs In3, In4 are both high then the thresholds of the first and second oscillators B1, B2 will be exceeded, but the threshold of the third oscillator B3 will not be exceeded. Thus, the second oscillator B2 will oscillate. Oscillation of the second oscillator B2 will prevent the first oscillator B1 from oscillating via the inhibitory connection 90. Thus, a low output will be provided at output 3, and a high output will be provided at output 4. This same operation will occur irrespective of which two of the three input In3-5 are high, since each of the inputs is connected to each of the oscillators B1-3.

If all three of the inputs In3-5 are high, then the thresholds of all three B1-3 oscillators will be exceeded. Oscillation of the third oscillator B3 will, via the inhibitory connection 80, prevent the second oscillator B2 from oscillating. Since the second oscillator B2 does not oscillate, the inhibitory connection 90 between the second oscillator B2 and the first oscillator B1 has no effect. Thus, the first oscillator B1 will also oscillate. The outputs 3 and the output 4 are thus both high.

The above explanation demonstrates that the binary adder shown in FIG. 16 provides operation according to the truth table shown as Table 2 further above.

The binary adder shown in FIG. 16 does not merely rely on conventional logic gates that have one or two inputs. Instead, three inputs are provided to each oscillator B1-3. Each oscillator behaves differently, according to its threshold. In alternative embodiments, the properties other than the thresholds of the oscillators may be used to provide a similar effect. For example, each oscillator B1-3 may have the same threshold, but may be provided with a different bias current.

In the above described embodiments, coupled oscillators have been used to create a binary half-adder and a binary adder. In order to achieve this, the oscillators were coupled in a manner such that they formed XOR, AND and OR logic gates. It will be appreciated that it is also within the scope of the invention to use coupled oscillators to form other types of logic gate. FIGS. 17 and 18 show coupled oscillators which form a NOR gate and a NAND gate respectively.

The NOR gate shown in FIG. 17 comprises a first oscillator 8 which is connected to a first input In6 and a second input In7 via connections 68 and 78 respectively. The connections are both of low resistance, such that an input signal provided at either In6 or at In7 will cause oscillator 8 to oscillate. A connection 100 extends between the first oscillator 8 and a second oscillator 9. The second oscillator 9 is provided with a constant power input P such that the second oscillator 9 oscillates. However, when the first oscillator 8 is oscillating, oscillation of the second oscillator 9 is suppressed via the connection 100.

Table 3 is a truth table for the oscillators shown in FIG. 17. The truth table reflects the above description, and demonstrates that the oscillators 8 and 9 act as a NOR logic gate.

TABLE 3

| In6 | In7 | Out5 |
|---|---|---|
| 0 | 0 | 1 |
| 0 | 1 | 0 |
| 1 | 0 | 0 |
| 1 | 1 | 0 |

The NAND gate shown in FIG. 18 comprises a first oscillator 301 which is connected to a first input In8 and a second input In9 via connections 810 and 910 respectively. The connections are both of high resistance, such that an input signal provided at both In8 and at In9 is required to cause oscillator 801 to oscillate. A connection 800 extends between the first oscillator 801 and a second oscillator 802. The second oscillator 802 is provided with a constant power input P such that the second oscillator 802 oscillates. However, when the first oscillator 801 is oscillating, oscillation of the second oscillator 802 is suppressed via the connection 800.

Table 4 is a truth table for the oscillators shown in FIG. 18. The truth table reflects the above description, and demonstrates that the oscillators 801 and 802 act as a NAND logic gate.

TABLE 4

| In8 | In9 | Out6 |
|---|---|---|
| 0 | 0 | 1 |
| 0 | 1 | 1 |
| 1 | 0 | 1 |
| 1 | 1 | 0 |

Any of the logic gates described above, for example NOR and NAND gates, may be used to form a memory. A known type of memory which may use NOR and/or NAND logic gates is known as a flip-flop. The use of logic gates to create a flip-flop will be well understood by a person skilled in the art. Memory using NOR and/or NAND gates formed by oscillators according to the present invention will require a continuous supply of power to some of the oscillators (as indicated by P in FIGS. 11 and 12). Because the memory will require a continuous supply of power, the memory is known as dynamic memory. The power required to keep oscillators in a stable limit-cycle oscillation may be relatively small (for example compared with the power required by a conventional memory).

It will be appreciated that logic gates formed from oscillators according to the present invention may be used to form any suitable type of memory.

A multiplicity of binary half-adders according to the invention may be used to replace half-adders formed using conventional transistor configurations in application areas other than computer processors and memory.

The invention provides a different approach to using neurons (or electrical circuits which approximate neurons) in computing. Instead of attempting to replicate a biological system, where millions of connections are provided to each neuron, only two or three connections (for example) are provided to each neuron. The neurons are configured to provide a binary half-adder, a building block of binary logical circuits, rather than attempting to build a neural network with a complex web of interconnections.

The invention claimed is:

1. A binary half-adder comprising first and second oscillators, each oscillator being connected to a first input and to a second input, the second oscillator being connected to the first oscillator, wherein the first oscillator is configured to oscillate if the first input is high or the second input is high, the second oscillator is configured to oscillate if the first and the second inputs are high, and wherein the connection between the second oscillator and the first oscillator is configured to suppress oscillation of the first oscillator if the second oscillator is oscillating.

2. The binary half-adder of claim 1, wherein each oscillator is configured to tend towards a stable non-oscillating state in the absence of an external input, and is configured to oscillate at a limit-cycle in the presence of an external input which is above a threshold.

3. The binary half-adder of claim 2, wherein at least one of the oscillators is configured to tend towards a stable non-oscillating state if the external input exceeds an upper threshold.

4. The binary half-adder of any of claim 1, wherein the first oscillator and the second oscillator are electrical circuits.

5. The binary half adder of claim 4, wherein the first oscillator and the second oscillator comprise a plurality of FETs.

6. The binary half-adder of claim 4, wherein the first oscillator and the second oscillator are Fitzhugh-Nagumo oscillators, and an electrical circuit provides the connection between the second oscillator and the first oscillator, the connection being an inhibitory connection.

7. The binary half-adder of claim 4, wherein the first oscillator is formed from a pair of Josephson junctions, the second oscillator is formed from a pair of Josephson junctions, and an electrical circuit provides the connection between the second oscillator and the first oscillator, the connection being an inhibitory connection.

8. The binary half-adder of any of claim 1, wherein the connection between the second oscillator and the first oscillator comprises a slave oscillator which is configured to oscillate out of phase with the first oscillator and thereby cause oscillator death of the first oscillator.

9. The binary half-adder of claim 1, wherein the second oscillator has a higher threshold than the first oscillator.

10. The binary half-adder of claim 1, wherein the first oscillator receives a greater bias current or bias voltage that the second oscillator.

11. The binary half-adder of claim 1, wherein connections from the first and second inputs to the second oscillator have a higher impedance than connections from the first and second inputs to the first oscillator.

12. The binary half-adder of claim 1, wherein the first oscillator and the second oscillator are neurons, the connection is a synapse, and the second neuron is configured to produce an inhibitory neurotransmitter when it is oscillating.

13. A binary adder comprising:
a first binary half-adder comprising a first and second oscillators, each oscillator being connected to a first input and to a second input, the second oscillator being connected to the first oscillator, wherein the first oscillator is configured to oscillate if the first input is high or the second input is high, the second oscillator is configured to oscillate if the first and the second inputs are high, and wherein the connection between the second oscillator and the first oscillator is configured to suppress oscillation of the first oscillator if the second oscillator is oscillating;

a second binary half-adder comprising a third and fourth oscillators, each oscillator being connected to a third input and to a fourth input, the fourth oscillator being connected to the third oscillator, wherein the third oscillator is configured to oscillate if the third input is high or the fourth input is high, the fourth oscillator is configured to oscillate if the third and the fourth inputs are high, and wherein the connection between the fourth oscillator and the third oscillator is configured to suppress oscillation of the third oscillator if the fourth oscillator is oscillating; and the binary half-adders being combined together with an additional oscillator.

14. A binary adder comprising:

a binary half-adder comprising first and second oscillators;

a third oscillator which is connected to the second oscillator, the connection between the third oscillator and the second oscillator being configured to suppress oscillation of the second oscillator if the third oscillator is oscillating;

wherein the first, second and third oscillators are each connected to first, second and third inputs, the first oscillator being configured to oscillate if any of the first, second or third inputs are high, the second oscillator being configured to oscillate if any two of the first, second or third inputs are high, and the third oscillator being configured to oscillate if the first, second and third inputs are high.

15. An apparatus comprising a first oscillator connected to a second oscillator, the connection between the second oscillator and the first oscillator being configured to suppress oscillation of the first oscillator if the second oscillator is oscillating, wherein the first oscillator is connected to a power supply such that the first oscillator will oscillate unless oscillation of the first oscillator is suppressed by the second oscillator, and wherein two inputs are provided to the second oscillator and the threshold of the second oscillator is such that the second oscillator will only oscillate if both the first and second inputs are high.

16. The apparatus of claim 1, wherein the first oscillator is a neuron and the second oscillator is a neuron, the second neuron being connected to the first neuron such that firing of the first neuron is inhibited or suppressed when the second neuron is firing.

17. The apparatus of claim 16, wherein a third neuron is connected between the second neuron and the first neuron, the third neuron being configured to stop firing of the first neuron when the second neuron is firing.

18. The apparatus of claim 1, wherein an additional oscillator is connected between the second oscillator and the first oscillator, and wherein the additional oscillator is configured such that oscillation of the additional oscillator will stop oscillation of the first oscillator.

* * * * *